United States Patent
Kim

(10) Patent No.: US 9,286,950 B2
(45) Date of Patent: Mar. 15, 2016

(54) SEMICONDUCTOR CHIP, MEMORY CHIP, SEMICONDUCTOR PACKAGE AND MEMORY SYSTEM

(75) Inventor: Boseong Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 802 days.

(21) Appl. No.: 13/462,321

(22) Filed: May 2, 2012

(65) Prior Publication Data

US 2012/0281449 A1  Nov. 8, 2012

(30) Foreign Application Priority Data

May 3, 2011  (KR) .................. 10-2011-0042097

(51) Int. Cl.
*G11C 5/06* (2006.01)
*G11C 11/16* (2006.01)

(52) U.S. Cl.
CPC ............... *G11C 5/063* (2013.01); *G11C 11/16* (2013.01); *H01L 2224/48137* (2013.01); *H01L 2224/48145* (2013.01); *H01L 2225/06562* (2013.01)

(58) Field of Classification Search
CPC .............. G11C 5/06; G11C 5/063; H01L 2225/06562; H01L 2224/48137; H01L 2224/48145
USPC .................. 365/63, 51; 257/690, 686, 777
See application file for complete search history.

(56) References Cited

U.S. PATENT DOCUMENTS

| | | | |
|---|---|---|---|
| 6,649,428 B2 | 11/2003 | Kai | |
| 6,791,175 B2 | 9/2004 | Matsuo et al. | |
| 7,446,420 B1 | 11/2008 | Kim | |
| 7,494,846 B2 | 2/2009 | Hsu et al. | |
| 7,710,754 B2 * | 5/2010 | Kao | 365/51 |
| 7,994,621 B2 * | 8/2011 | Kim | 257/686 |
| 8,223,523 B2 * | 7/2012 | Jin et al. | 365/51 |
| 2005/0105316 A1 * | 5/2005 | Okuno | 365/51 |
| 2007/0228546 A1 * | 10/2007 | So et al. | 257/690 |
| 2009/0121336 A1 | 5/2009 | Kim | |
| 2011/0026293 A1 * | 2/2011 | Riho | 365/63 |
| 2011/0085366 A1 * | 4/2011 | Riho | 365/51 |
| 2011/0102065 A1 * | 5/2011 | Jin et al. | 327/524 |
| 2011/0211414 A1 * | 9/2011 | Musha | 365/230.03 |

FOREIGN PATENT DOCUMENTS

| | | |
|---|---|---|
| JP | 2003-110086 A | 4/2003 |
| JP | 2010-232702 A | 10/2010 |
| KR | 10-0438883 B1 | 6/2004 |
| KR | 10-0506105 B1 | 7/2005 |
| KR | 10-0724653 B1 | 5/2007 |
| KR | 10-0871381 B1 | 11/2008 |
| KR | 10-0910229 B1 | 7/2009 |

* cited by examiner

*Primary Examiner* — Toan Le
(74) *Attorney, Agent, or Firm* — Sughrue Mion, PLLC

(57) ABSTRACT

A semiconductor chip includes a plurality of signal and power pads; and a plurality of chip selection pads, wherein at least one of the plurality of chip selection pads includes a normal pad and an inverse pad.

40 Claims, 36 Drawing Sheets

Fig. 7

|        | CSP1 || CSP2 || CSP3 || CS |
|--------|----|----|----|----|----|----|----|
|        | NP | IP | NP | IP | NP | IP |    |
| 100a_8 | F  | 1  | F  | 1  | F  | 1  | 0  |
| 100a_7 | F  | 1  | F  | 1  | 1  | F  | 0  |
| 100a_6 | F  | 1  | 1  | F  | F  | 1  | 0  |
| 100a_5 | F  | 1  | 1  | F  | 1  | F  | 0  |
| 100a_4 | 1  | F  | F  | 1  | F  | 1  | 0  |
| 100a_3 | 1  | F  | F  | 1  | 1  | F  | 0  |
| 100a_2 | 1  | F  | 1  | F  | F  | 1  | 0  |
| 100a_1 | 1  | F  | 1  | F  | 1  | F  | 1  |

(CSPa,CSPb,CSPc)=(1,1,1)

Fig. 8

|        | CSP1 || CSP2 || CSP3 || CS |
|--------|----|----|----|----|----|----|----|
|        | NP | IP | NP | IP | NP | IP |    |
| 100a_8 | F  | 1  | F  | 1  | F  | 0  | 0  |
| 100a_7 | F  | 1  | F  | 1  | 0  | F  | 0  |
| 100a_6 | F  | 1  | 1  | F  | F  | 0  | 0  |
| 100a_5 | F  | 1  | 1  | F  | 0  | F  | 0  |
| 100a_4 | 1  | F  | F  | 1  | F  | 0  | 0  |
| 100a_3 | 1  | F  | F  | 1  | 0  | F  | 0  |
| 100a_2 | 1  | F  | 1  | F  | F  | 0  | 1  |
| 100a_1 | 1  | F  | 1  | F  | 0  | F  | 0  |

(CSPa,CSPb,CSPc)=(1,1,0)

Fig. 9

|        | CSP1 |    | CSP2 |    | CSP3 |    | CS |
|--------|------|----|------|----|------|----|----|
|        | NP   | IP | NP   | IP | NP   | IP |    |
| 100a_8 | F    | 1  | F    | 0  | F    | 1  | 0  |
| 100a_7 | F    | 1  | F    | 0  | 1    | F  | 0  |
| 100a_6 | F    | 1  | 0    | F  | F    | 1  | 0  |
| 100a_5 | F    | 1  | 0    | F  | 1    | F  | 0  |
| 100a_4 | 1    | F  | F    | 0  | F    | 1  | 0  |
| 100a_3 | 1    | F  | F    | 0  | 1    | F  | 1  |
| 100a_2 | 1    | F  | 0    | F  | F    | 1  | 0  |
| 100a_1 | 1    | F  | 0    | F  | 1    | F  | 0  |

(CSPa,CSPb,CSPc)=(1,0,1)

Fig. 10

|        | CSP1 |    | CSP2 |    | CSP3 |    | CS |
|--------|------|----|------|----|------|----|----|
|        | NP   | IP | NP   | IP | NP   | IP |    |
| 100a_8 | F    | 1  | F    | 0  | F    | 0  | 0  |
| 100a_7 | F    | 1  | F    | 0  | 0    | F  | 0  |
| 100a_6 | F    | 1  | 0    | F  | F    | 0  | 0  |
| 100a_5 | F    | 1  | 0    | F  | 0    | F  | 0  |
| 100a_4 | 1    | F  | F    | 0  | F    | 0  | 1  |
| 100a_3 | 1    | F  | F    | 0  | 0    | F  | 0  |
| 100a_2 | 1    | F  | 0    | F  | F    | 0  | 0  |
| 100a_1 | 1    | F  | 0    | F  | 0    | F  | 0  |

(CSPa,CSPb,CSPc)=(1,0,0)

Fig. 11

| | CSP1 | | CSP2 | | CSP3 | | CS |
|---|---|---|---|---|---|---|---|
| | NP | IP | NP | IP | NP | IP | |
| 100a_8 | F | 0 | F | 1 | F | 1 | 0 |
| 100a_7 | F | 0 | F | 1 | 1 | F | 0 |
| 100a_6 | F | 0 | 1 | F | F | 1 | 0 |
| 100a_5 | F | 0 | 1 | F | 1 | F | 1 |
| 100a_4 | 0 | F | F | 1 | F | 1 | 0 |
| 100a_3 | 0 | F | F | 1 | 1 | F | 0 |
| 100a_2 | 0 | F | 1 | F | F | 1 | 0 |
| 100a_1 | 0 | F | 1 | F | 1 | F | 0 |

(CSPa,CSPb,CSPc)=(0,1,1)

Fig. 12

| | CSP1 | | CSP2 | | CSP3 | | CS |
|---|---|---|---|---|---|---|---|
| | NP | IP | NP | IP | NP | IP | |
| 100a_8 | F | 0 | F | 1 | F | 0 | 0 |
| 100a_7 | F | 0 | F | 1 | 0 | F | 0 |
| 100a_6 | F | 0 | 1 | F | F | 0 | 1 |
| 100a_5 | F | 0 | 1 | F | 0 | F | 0 |
| 100a_4 | 0 | F | F | 1 | F | 0 | 0 |
| 100a_3 | 0 | F | F | 1 | 0 | F | 0 |
| 100a_2 | 0 | F | 1 | F | F | 0 | 0 |
| 100a_1 | 0 | F | 1 | F | 0 | F | 0 |

(CSPa,CSPb,CSPc)=(0,1,0)

Fig. 13

| | CSP1 | | CSP2 | | CSP3 | | CS |
|---|---|---|---|---|---|---|---|
| | NP | IP | NP | IP | NP | IP | |
| 100a_8 | F | 0 | F | 0 | F | 1 | 0 |
| 100a_7 | F | 0 | F | 0 | 1 | F | 1 |
| 100a_6 | F | 0 | 0 | F | F | 1 | 0 |
| 100a_5 | F | 0 | 0 | F | 1 | F | 0 |
| 100a_4 | 0 | F | F | 0 | F | 1 | 0 |
| 100a_3 | 0 | F | F | 0 | 1 | F | 0 |
| 100a_2 | 0 | F | 0 | F | F | 1 | 0 |
| 100a_1 | 0 | F | 0 | F | 1 | F | 0 |

(CSPa, CSPb, CSPc) = (0, 0, 1)

Fig. 14

| | CSP1 | | CSP2 | | CSP3 | | CS |
|---|---|---|---|---|---|---|---|
| | NP | IP | NP | IP | NP | IP | |
| 100a_8 | F | 0 | F | 0 | F | 0 | 1 |
| 100a_7 | F | 0 | F | 0 | 0 | F | 0 |
| 100a_6 | F | 0 | 0 | F | F | 0 | 0 |
| 100a_5 | F | 0 | 0 | F | 0 | F | 0 |
| 100a_4 | 0 | F | F | 0 | F | 0 | 0 |
| 100a_3 | 0 | F | F | 0 | 0 | F | 0 |
| 100a_2 | 0 | F | 0 | F | F | 0 | 0 |
| 100a_1 | 0 | F | 0 | F | 0 | F | 0 |

(CSPa, CSPb, CSPc) = (0, 0, 0)

SEMICONDUCTOR CHIP, MEMORY CHIP, SEMICONDUCTOR PACKAGE AND MEMORY SYSTEM

CROSS-REFERENCE TO RELATED APPLICATIONS

This application claims the benefits, under 35 U.S.C §119, of Korean Patent Application No. 10-2011-0042097 filed May 3, 2011, the entirety of which is incorporated by reference herein.

BACKGROUND

Exemplary embodiments relate to a semiconductor chip, a memory chip, a semiconductor package, and a memory system.

Memory and non-memory semiconductor may be implemented using semiconductor materials such as silicon (Si), germanium (Ge), gallium arsenide (GaAs), indium phosphide (InP), etc. A semiconductor chip may be made by forming semiconductor elements, i.e., transistors or memory cells in a semiconductor substrate. A semiconductor package may be made by packing one or more semiconductor chips. An electronic device, i.e., a memory system, may be made by providing one or more semiconductor packages on a printed circuit board. The memory system may include a memory semiconductor, i.e., a nonvolatile memory or a volatile memory and a non-memory semiconductor, i.e., a memory controller.

The memory controller may be configured to control a plurality of memories. The memory controller may generate chip selection signals to select the plurality of memories.

SUMMARY

According to an aspect of exemplary embodiments, there is provided a semiconductor chip which comprises a plurality of signal and power pads; and a plurality of chip selection pads, wherein at least one of the plurality of chip selection pads comprises a normal pad and an inverse pad.

In this embodiment, the semiconductor chip may be a memory chip.

In this embodiment, the semiconductor chip may be a memory controller chip.

In this embodiment, the normal pad of the at least one of the plurality of chip selection pads may be connected with a first conduction line and the inverse pad of the at least one of the plurality of chip selection pads may be connected with a second conduction line, the first conduction line and the second conduction line are connected in common with a third conduction line.

In this embodiment, the semiconductor chip may further comprise a logic gate configured to perform an AND operation with respect to the third conduction line of the plurality of chip selection pads, and the semiconductor chip may be activated or inactivated according to an output of the logic gate.

According to an aspect of a further exemplary embodiment, there is provided a memory chip which comprises at least one chip selection solder bump; at least one through silicon via electrically connected with the at least one chip selection solder bump; first and second fuses electrically connected with the at least one through silicon via; normal and inverse inputs, at least one of the normal and inverse inputs is electrically connected with the first and second fuses; and at least one chip selection pad electrically connected with the first and second fuses, respectively.

According to an aspect of a further exemplary embodiment, there is provided a memory chip which comprises a plurality of signal and power pads; a plurality of chip selection pads; and a logic gate configured to operate the plurality of chip selection pads, wherein the memory chip is activated or inactivated according to an output of the logic gate.

According to an aspect of a further exemplary embodiment, there is provided a semiconductor package comprising first and second memory chips configured to be stacked, wherein at least one of the first memory chips and at least one of the second memory chips comprises a plurality of signal and power pads and a plurality of chip selection pads.

In this embodiment, at least one of the plurality of chip selection pads may include a normal pad and an inverse pad.

In this embodiment, the first and second memory chips may be stacked in a cascade shape.

In this embodiment, one of the normal pad and the inverse pad of a first chip selection pad of a first memory chip may be connected with a first conduction line and the other one of the normal pad and the inverse pad of the first selection pad of the first memory chip is floated.

In this embodiment, one of the normal pad and the inverse pad of a first chip selection pad of a second memory chip is connected with the first conduction line and the other one of the normal pad and the inverse pad of the first selection pad of the second memory chips is floated.

In this embodiment, one of the normal pad and the inverse pad of a second chip selection pad of the first memory chip may be connected with a second conduction line, different from the first conduction line, and the other one of the normal pad and the inverse pad of the second chip selection pad of the first memory chip is floated.

In this embodiment, the semiconductor package may further comprise a controller chip configured to control the first and second memory chips, and the controller chip may comprise a plurality of second signal and power pads, at least one of the plurality of second signal and power pads corresponds with the plurality of signal and power pads; and a plurality of control chip selection pads, at least one of the plurality of control chip selection pads corresponds with the plurality of chip selection pads, the first conduction line is connected with one of the plurality of control chip selection pads.

In this embodiment, the controller chip may be configured to select the first and second memory chips by controlling output signals of the plurality of control chip selection pads.

In this embodiment, the semiconductor package may further comprise a plurality of signal and power input and output nodes, at least one of the plurality of signal and power input and output nodes corresponds with the plurality of signal and power pads; and a plurality of chip selection nodes, at least one of the plurality of chip selection nodes corresponds with the plurality of chip selection pads, the first conduction line is connected with one of the plurality of chip selection nodes.

In this embodiment, the plurality of chip selection nodes may be a plurality of pins or a plurality of solder balls.

In this embodiment, the first and second memory chips may be stacked in a vertical pillar shape.

In this embodiment, the semiconductor package may further comprise a controller chip configured to control the first and second memory chips, and the controller chip may comprise a plurality of second signal and power pads, at least one of the plurality of second signal and power pads correspond with the plurality of signal and power pads; and a plurality of control chip selection pads, at least one of the plurality of control chip selection pads corresponds with the plurality of chip selection pads.

In this embodiment, one of the normal pad and the inverse pad of a first chip selection pad of the first memory chip may be electrically connected with a first control chip selection pad of the plurality of control chip selection pads and the other one of the normal pad and the inverse pad of the first chip selection pad of the first memory chip is floated.

In this embodiment, one of the normal pad and the inverse pad of a first chip selection pad of a second memory chip may be electrically connected with the first control chip selection pad and the other one of the normal pad and the inverse pad of the first chip selection pad of the second memory chip is floated.

In this embodiment, one of the normal pad and the inverse pad of a second chip selection pad of the first memory chip may be electrically connected with a second control chip selection pad, different from the first control chip selection pad, of the plurality of control chip selection pads and the other one of the normal pad and the inverse pad of the second chip selection pad of the first memory chip is floated.

In this embodiment, the semiconductor package may further comprise a plurality of signal and power input and output nodes, at least one of the plurality of signal and power input and output nodes corresponds with the plurality of signal and power pads; and a plurality of chip selection nodes, at least one of the plurality of chip selection nodes corresponds with the plurality of chip selection pads.

In this embodiment, one of the normal pad and the inverse pad of a first chip selection pad of the first memory chip may be electrically connected with a first chip selection node of the plurality of chip selection nodes and the other one of the normal pad and the inverse pad of the first chip selection pad of the first memory chip is floated.

In this embodiment, one of the normal pad and the inverse pad of a first chip selection pad of the second memory chip may be electrically connected with the first chip selection node and the other one of the normal pad and the inverse pad of the first chip selection pad of the second memory chip is floated.

In this embodiment, one of the normal pad and the inverse pad of a second chip selection pad of the first memory chip may be electrically connected with a second chip selection node, different from the first chip selection node, of the plurality of chip selection nodes and the other one of the normal pad and the inverse pad of the second chip selection pad of the first memory chip is floated.

In this embodiment, the first and second memory chips may be stacked in a cascade shape.

In this embodiment, a part of a first chip selection pad of the first and second memory chips may be connected in common with a first conduction line and a remaining part of the first chip selection pad is connected in common with a second conduction line.

In this embodiment, the semiconductor package may further comprise a controller chip configured to control the first and second memory chips, wherein the controller chip comprises a plurality of control chip selection pads, at least one of the plurality of controller chip selection pads corresponds with the plurality of chip selection pads, at least one of the plurality of control chip selection pads comprises a normal pad and an inverse pad.

In this embodiment, the first conduction line may be electrically connected with the normal pad of a first control chip selection pad of the plurality of control chip selection pads and the second conduction line is electrically connected with the inverse pad of the first control chip selection pad.

In this embodiment, the semiconductor package may further comprise chip selection nodes, at least one of the chip selection nodes corresponds with the plurality of chip selection pads, wherein at least one of the chip selection nodes comprises a normal node and an inverse node, and wherein a first conduction line is electrically connected with the normal node of a first chip selection node of the chip selection nodes and a second conduction line is electrically connected with the inverse node of the first chip selection node.

In this embodiment, the first and second memory chips may be stacked in a vertical pillar shape.

In this embodiment, the semiconductor package may further comprise a controller chip configured to control the first and second memory chips, and the controller chip comprises a plurality of control chip selection pads, at least one of the plurality of control chip selection pads corresponds with the plurality of chip selection pads, at least one of the plurality of control chip selection pads comprises a normal pad and an inverse pad.

In this embodiment, a part of a first chip selection pad of the first and second memory chips may be electrically connected with the normal pad of a first control chip selection pad of the controller chip via a plurality of first conduction lines and a remaining part of the first chip selection pad of the first and second memory chips is electrically connected with the inverse pad of the first control chip selection pad via a plurality of second conduction lines.

In this embodiment, the semiconductor package may further comprise a plurality of chip selection nodes, at least one of the plurality of chip selection nodes corresponds with the plurality of chip selection pads, wherein at least one of the chip selection nodes includes a normal node and an inverse node.

In this embodiment, a part of a first chip selection node of the first and second memory chips may be electrically connected with the normal pad of the first chip selection node of the chip selection nodes via a plurality of first conduction lines and a remaining part of the first chip selection nodes of the first and second memory chips is electrically connected with the inverse pad of the first chip selection node via a plurality of second conduction lines.

In this embodiment, the first memory chip may comprise a plurality of chip selection solder bumps; a plurality of through silicon vias, at least one of the plurality of through silicon vias is electrically connected with the plurality of chip selection solder bumps and a plurality of chip selection pads; first and second fuses electrically connected with a through silicon via of the plurality of through silicon vias; and normal and inverse inputs, at least one of the normal and inverse inputs is electrically connected with the first and second fuses.

In this embodiment, the second memory chip may have a same structure as a first memory chip, and at least one or more chip selection solder bumps of the second memory chip may be connected with at least one or more chip selection pads of the first memory chip.

In this embodiment, one of the first and second fuses may be connected with the through silicon via of the first memory chip is cut and the other one of the first and second fuses maintains an electric connection state.

According to an aspect of a further exemplary embodiment, there is provided a semiconductor package comprising a controller chip configured to control a memory; a plurality of signal and power nodes electrically connected with a plurality of signal and power pads of the controller chip; and a plurality of chip selection nodes electrically connected with a plurality of chip selection pads of the controller chip. A chip selection pad of the plurality of chip selection nodes comprises a normal pad and an inverse pad, and the chip selection node of the plurality of chip selection nodes comprises a normal node and an inverse node, at least one of the normal node and the inverse node is connected with the normal pad and the inverse pad.

According to an aspect of a further exemplary embodiment, there is provided a memory controller chip is further provided which comprises a plurality of signal and power pads; and a plurality of chip selection pads, wherein at least one of the chip selection pads is independently controlled to have a logically high value or a logically low value, and wherein a combination of the chip selection pads is output as a chip selection signal.

According to an aspect of a further exemplary embodiment, there is provided a memory system which comprises first and second memory chips configured to be stacked; and a memory controller chip configured to control the first and second memory chips, wherein each of the first and second memory chips is configured to communicate with the memory controller chip via a plurality of signal and power pads and a plurality of chip selection pads.

In this embodiment, the first and second memory chips and the memory controller chip may constitute a memory card.

In this embodiment, the first and second memory chips and the memory controller chip may constitute a solid state drive.

In this embodiment, the first and second memory chips and the memory controller chip may form a single package.

In this embodiment, the first and second memory chips form a memory package and the memory controller chip may forms a controller package.

According to an aspect of a further exemplary embodiment, there is provided a solid state drive which comprises a substrate, a plurality of memory packages, a controller package, and a connector.

In this embodiment, at least one of the plurality of memory packages comprises first and second memory chips, the first and second memory chips are configured to be stacked.

In this embodiment, the controller package comprises a controller chip, the controller chip configured to select the at least one of the plurality of memory packages using a smaller number of signals than a total number of signals of the at least one of the plurality of memory packages.

In this embodiment, at least one of the plurality of memory packages and the controller package communicates with an external device via the connector.

BRIEF DESCRIPTION OF THE FIGURES

The above and other objects and features will become apparent from the following description with reference to the following figures, wherein like reference numerals refer to like parts throughout the various figures unless otherwise specified.

FIG. 7 is a diagram for describing a relationship between chip selection signals and signals of the first to third chip selection pads of the first to eighth memory chips when output signals of control chip selection pads are '111'.

FIG. 8 is a diagram for describing a relationship between chip selection signals and signals of the first to third chip selection pads of the first to eighth memory chips when output signals of control chip selection pads are '110'.

FIG. 9 is a diagram for describing a relationship between chip selection signals and signals of the first to third chip selection pads of the first to eighth memory chips when output signals of control chip selection pads are '101'.

FIG. 10 is a diagram for describing a relationship between chip selection signals and signals of the first to third chip selection pads of the first to eighth memory chips when output signals of control chip selection pads are '100'.

FIG. 11 is a diagram for describing a relationship between chip selection signals and signals of the first to third chip selection pads of the first to eighth memory chips when output signals of control chip selection pads are '011'.

FIG. 12 is a diagram for describing a relationship between chip selection signals and signals of the first to third chip selection pads of the first to eighth memory chips when output signals of control chip selection pads are '010'.

FIG. 13 is a diagram for describing a relationship between chip selection signals and signals of the first to third chip selection pads of the first to eighth memory chips when output signals of control chip selection pads are '001'.

FIG. 14 is a diagram for describing a relationship between chip selection signals and signals of the first to third chip selection pads of the first to eighth memory chips when output signals of control chip selection pads are '000'.

DETAILED DESCRIPTION

Figure 1:
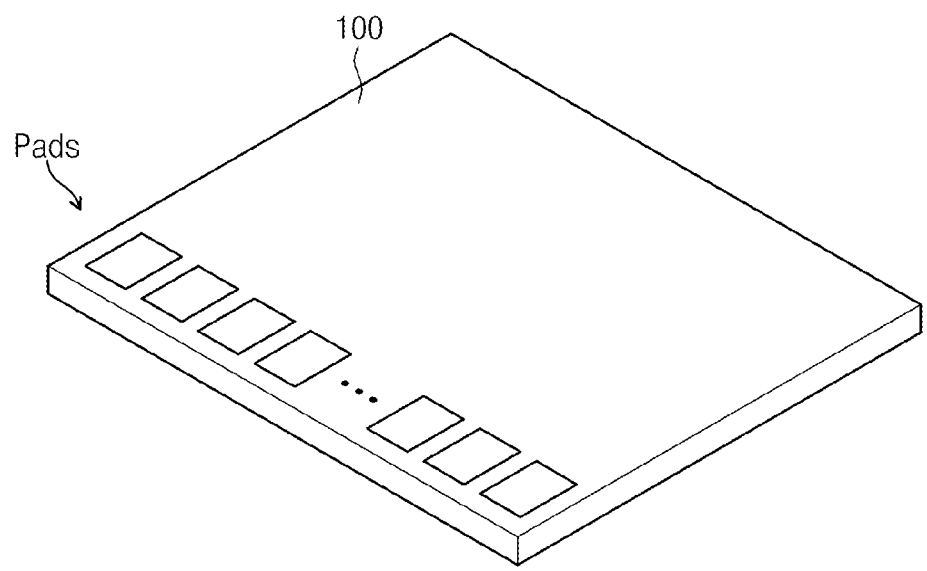
FIG. 1 is a diagram illustrating a semiconductor chip according to an exemplary embodiment.

Exemplary embodiments are described more fully hereinafter with reference to the accompanying drawings, in which embodiments are shown. The exemplary embodiments may, however, be embodied in many different forms and should not be construed as limited to the embodiments set forth herein. Rather, these embodiments are provided so that this disclosure will be thorough and complete, and will fully convey the scope of the exemplary embodiments to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "lower", "under", "above", "upper" etc., may be used herein for ease of description to describe one element's relationship to another element(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of exemplary embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or a layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these exemplary embodiments belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating a semiconductor chip according to an exemplary embodiment. Referring to FIG. 1, a plurality of pads may be provided at a semiconductor chip 100. The plurality of pads may be provided on an upper surface of the semiconductor chip 100. The plurality of pads may be provided on a part of an upper surface of the semiconductor chip 100. The semiconductor chip 100 may include a memory chip or a non-memory chip. The non-memory chip may include a memory controller chip configured to control the memory chip.

Figure 2:
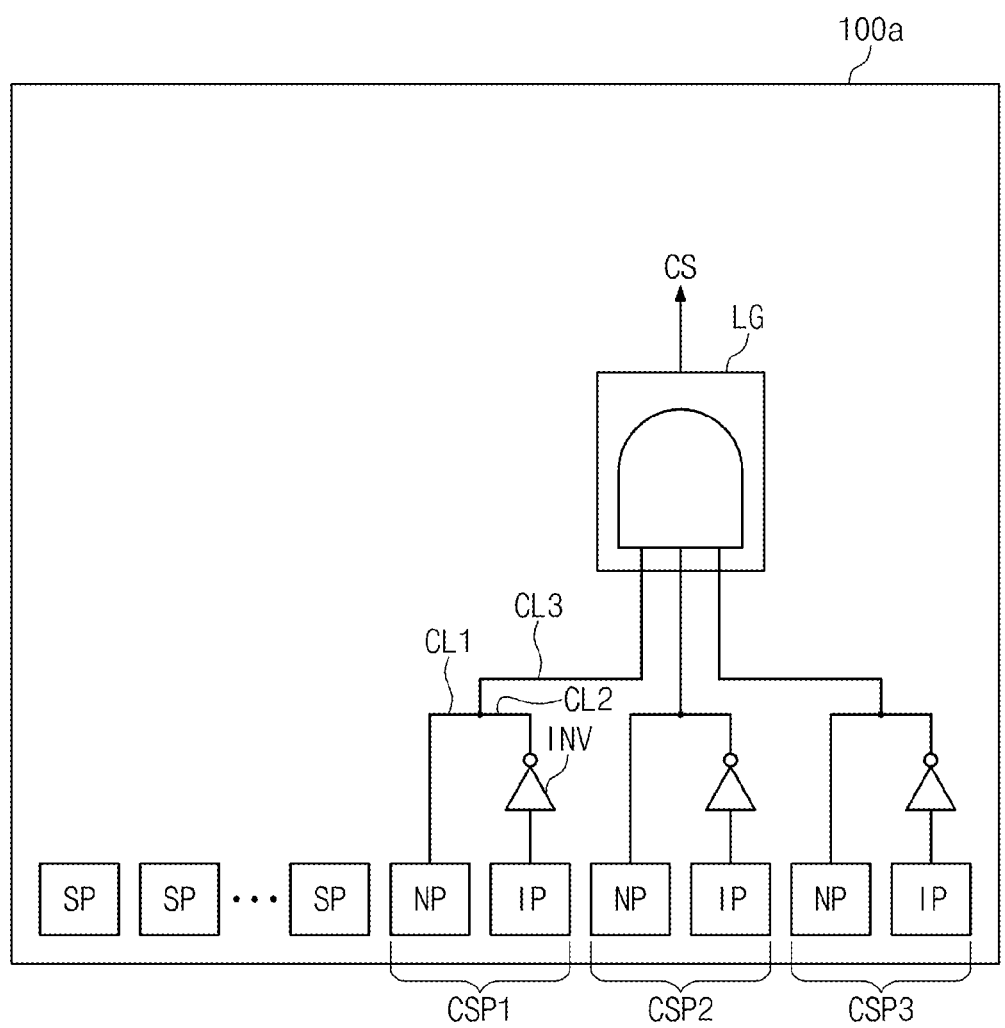
FIG. 2 is a diagram illustrating a memory chip according to an exemplary embodiment.

FIG. 2 is a diagram illustrating a memory chip according to an exemplary embodiment. Referring to FIG. 2, a memory chip 100a may be a volatile memory chip, i.e., an SRAM, a DRAM, an SDRAM, etc. or a nonvolatile memory chip, i.e., a ROM, a PROM, an EPROM, an EEPROM, a flash memory, a PRAM, an MRAM, an RRAM, a FRAM, etc.

Referring to FIG. 2, the memory chip 100a may include signal and power pads SP, the first to third chip selection pads CSP1 to CSP3, and a logic gate LG. Pads may be provided on a part of an upper surface of the memory chip 100a. The memory chip 100a may receive signals and powers from an external device via the signal and power pads SP and may output signals to the external device via the signal and power pads SP. For example, the memory chip 100a may exchange a command, an address, data, and various control signals with the external device via the signal and power pads SP.

The memory chip 100a may input chip selection signals from the external device via the first to third chip selection pads CSP1 to CSP3. Each of the first to third chip selection pads CSP1 to CSP3 may include a normal pad NP and an inverse pad IP. The normal pad NP may be connected with the first conduction line CL1, and the inverse pad IP may be connected with the second conduction line CL2 via an inverter INV. The first and second conduction lines CL1 and CL2 may be connected in common with the third conduction line CL3. In other words, outputs of the normal pad and the inverter INV may be connected in a wired-OR manner.

The third conduction lines CL3 each corresponding to the first to third chip selection pads CSP1 to CSP3 may be connected with the logic gate LG. The logic gate LG may be configured to AND signals on the third conduction lines CL3. An output of the logic gate LG may be used as a chip selection signal CS. For example, the memory chip 100a may be selected (i.e., activated) when the chip selection signal CS is logically high and may be unselected (i.e., inactivated) when the chip selection signal CS is logically low.

The number of chip selection pads of the memory chip 100a is not limited. For simplification, it is assumed that the memory chip 100a has the first to third chip selection pads CSP1 to CSP3.

Figure 3:
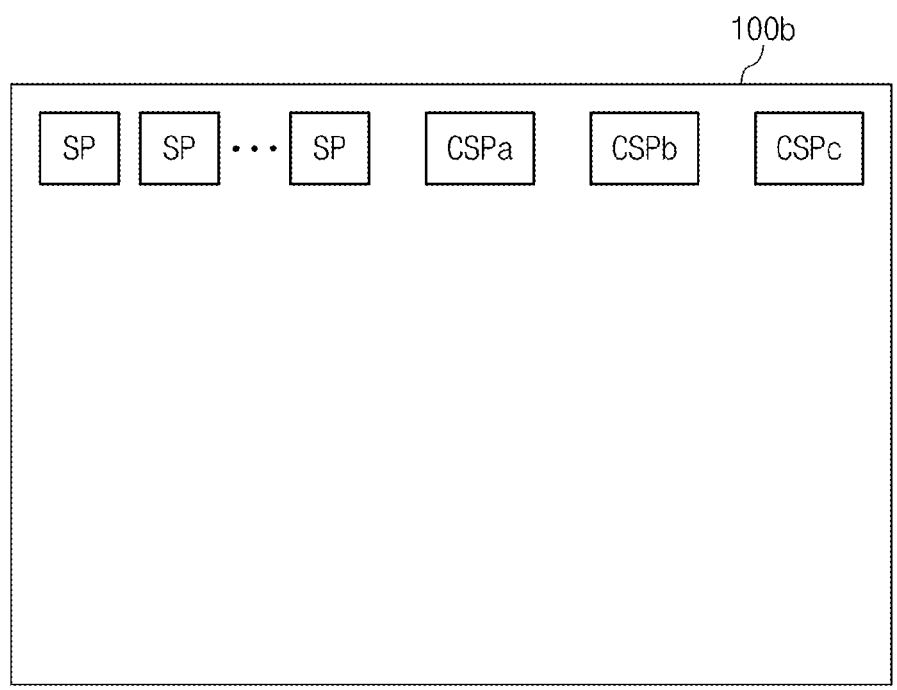
FIG. 3 is a diagram illustrating a memory controller chip according to an exemplary embodiment.

FIG. 3 is a diagram illustrating a memory controller chip according to an exemplary embodiment. A memory controller chip 100b may be configured to control at least one or more memory chips.

Referring to FIGS. 2 and 3, pads may be provided on a part of an upper surface of the memory controller chip 100b. The memory controller chip 100b may include signal and power pads SP and control chip selection pads CSPa to CSPc. The memory controller chip 100b may input signals and powers from an external device via the signal and power pads SP and may output signals to the external device via the signal and power pads SP. For example, the memory controller chip 100b may be configured to exchange a command, an address, data, and various control signals with the external device via the signal and power pads SP.

The memory controller chip 100b may output chip selection signals via the control chip selection pads CSPa to CSPc. One control chip selection pad CSPa, CSPb, or CSPc may correspond to one chip selection pad CSP1, CSP2, or CSP3 of a memory chip 100a in FIG. 2.

The number of control chip selection pads of the memory controller chip 100b is not limited. For simplification, it is assumed that the memory controller chip 100b includes three control chip selection pads CSPa to CSPc.

Figure 4:
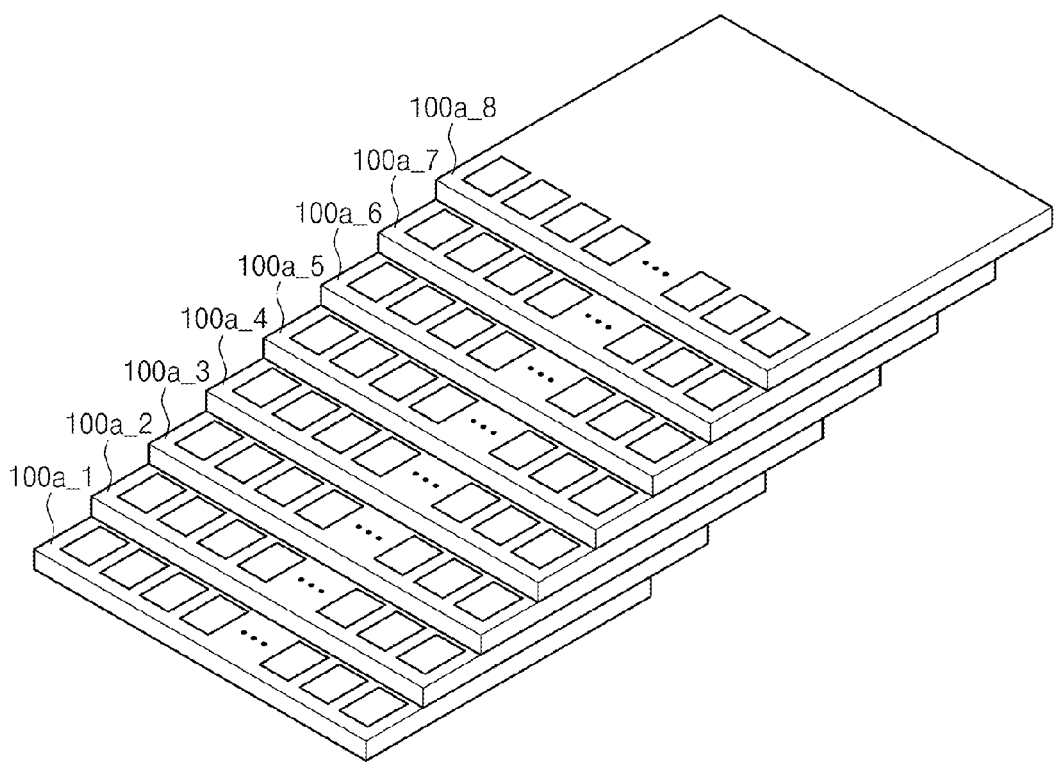
FIG. 4 is a diagram illustrating a structure in which a plurality of memory chips are stacked.

FIG. 4 is a diagram illustrating a structure that a plurality of memory chips is stacked. Referring to FIG. 4, memory chips 100a_1 to 100a_8 may be stacked in a cascade form. Pads may be provided on a part of an upper surface of the first memory chip 100a_1. The second memory chip 100a_2 may be stacked on the first memory chip 100a_1. The second memory chip 100a_2 may be stacked on the first memory chip 100a_1 so as to expose the pads of the first memory chip 100a_1.

The number of stacked memory chips is not limited. For simplification, it is assumed that eight memory chips 100a_1 to 100a_8 are stacked.

Each of the memory chips 100a_1 to 100a_8 may be configured to have the same structure as that described in FIG. 2. Each of the memory chips 100a_1 to 100a_8 may include the first to third chip selection pads CSP1, CSP2, and CSP3, and each chip selection pad may include a normal pad NP and an inverse pad IP.

Figure 5:
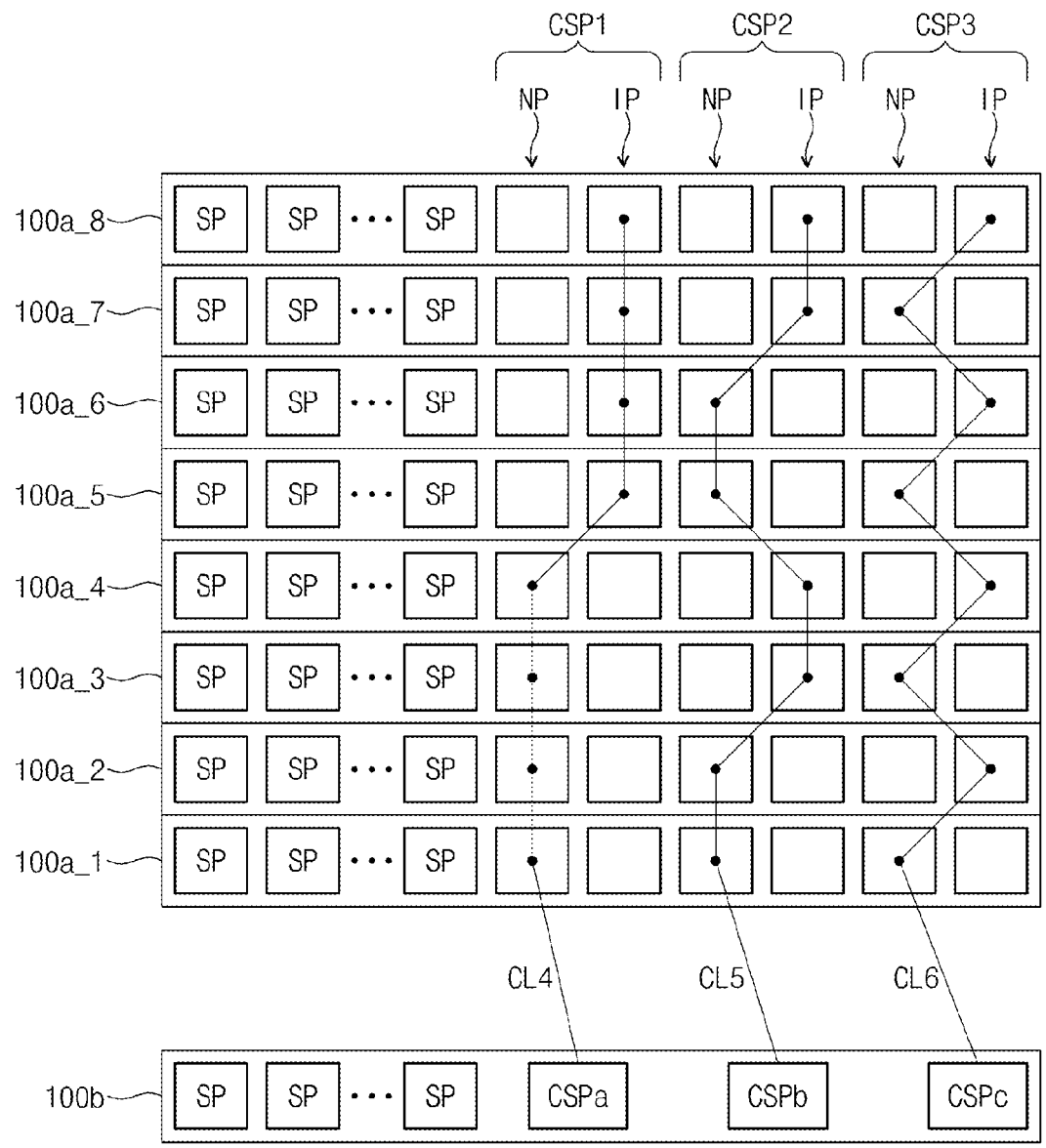
FIG. 5 is a diagram illustrating an interconnection structure between stacked memory chips and a memory controller chip according to an exemplary embodiment.

FIG. 5 is a diagram illustrating an interconnection structure between stacked memory chips and a memory controller chip according to an exemplary embodiment. Referring to FIG. 5, signal and power pads SP of the first to eighth memory chips 100a_1 to 100a_8 may be electrically connected with signal and power pads SP of a memory controller chip 100b, respectively.

The number of chip selection pads CSP1, CSP2, and CSP3 of each of the first to eighth memory chips 100a_1 to 100a_8 may be identical to that of control chip selection pads CSPa, CSPb, and CSPc of the memory controller chip 100b. Since each chip selection pad CSP includes a normal pad NP and an inverse pad IP, the number of pads used for chip selection in each of the first to eighth memory chips 100a_1 to 100a_8 may double the number of pads used for chip selection in the memory controller chip 100b.

The first chip selection pads CSP1 of the first to eighth memory chips 100a_1 to 100a_8 may be electrically connected with the fourth conduction line CL4, the second chip selection pads CSP2 thereof may be electrically connected with the fifth conduction line CL5, and the third chip selection pads CSP3 thereof may be electrically connected with the sixth conduction line CL6. In the first to eighth memory chips 100a_1 to 100a_8, one of the normal pad NP and the inverse pad IP of each chip selection pad may be electrically connected with a conduction line, and the other may be floated.

In an exemplary embodiment, as illustrated in FIG. 5, the fourth conduction line CL4 may be connected with the normal pad NP of the first chip selection pad CSP1 of the first memory chip 100a_1, the normal pad NP of the first chip selection pad CSP1 of the second memory chip 100a_2, the normal pad NP of the first chip selection pad CSP1 of the third memory chip 100a_3, the normal pad NP of the first chip selection pad CSP1 of the fourth memory chip 100a_4, the inverse pad IP of the first chip selection pad CSP1 of the fifth memory chip 100a_5, the inverse pad IP of the first chip selection pad CSP1 of the sixth memory chip 100a_6, the inverse pad IP of the first chip selection pad CSP1 of the seventh memory chip 100a_7, and the inverse pad IP of the first chip selection pad CSP1 of the eighth memory chip 100a_8.

The fifth conduction line CL5 may be connected with the normal pad NP of the second chip selection pad CSP2 of the first memory chip 100a_1, the normal pad NP of the second chip selection pad CSP2 of the second memory chip 100a_2, the inverse pad IP of the second chip selection pad CSP2 of the third memory chip 100a_3, the inverse pad IP of the second chip selection pad CSP2 of the fourth memory chip 100a_4, the normal pad NP of the second chip selection pad CSP2 of the fifth memory chip 100a_5, the normal pad NP of the second chip selection pad CSP2 of the sixth memory chip 100a_6, the inverse pad IP of the second chip selection pad CSP2 of the seventh memory chip 100a_7, and the inverse pad IP of the second chip selection pad CSP2 of the eighth memory chip 100a_8.

The sixth conduction line CL6 may be connected with the normal pad NP of the third chip selection pad CSP3 of the first memory chip 100a_1, the inverse pad IP of the third chip selection pad CSP3 of the second memory chip 100a_2, the normal pad NP of the third chip selection pad CSP3 of the third memory chip 100a_3, the inverse pad IP of the third chip selection pad CSP3 of the fourth memory chip 100a_4, the normal pad NP of the third chip selection pad CSP3 of the fifth memory chip 100a_5, the inverse pad IP of the third chip selection pad CSP3 of the sixth memory chip 100a_6, the normal pad NP of the third chip selection pad CSP3 of the seventh memory chip 100a_7, and the inverse pad IP of the third chip selection pad CSP3 of the eighth memory chip 100a_8.

The first to eighth memory chips 100a_1 to 100a_8 may be connected with the fourth to sixth conduction lines CL4 to CL6 in different patterns.

Figure 6:
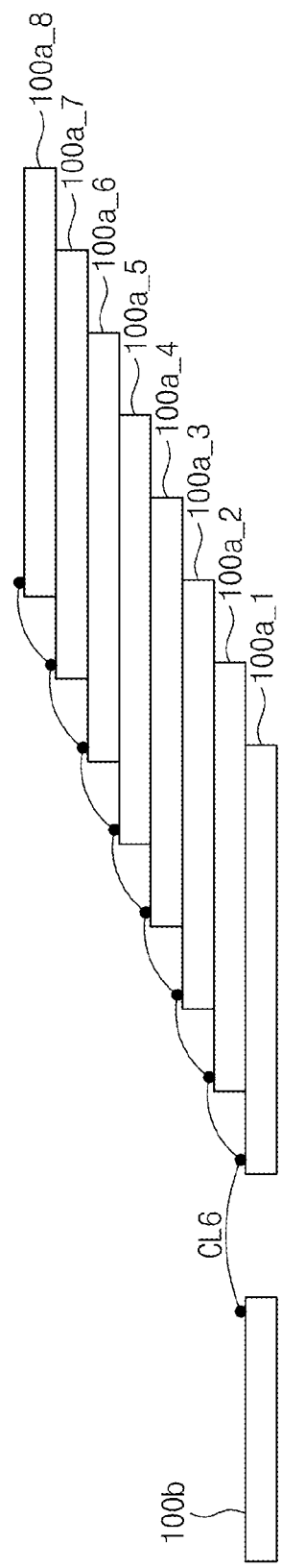
FIG. 6 is a diagram illustrating a lateral view of the first to eighth memory chips and a memory controller chip according to an exemplary embodiment.

FIG. 6 is a diagram illustrating a lateral view of the first to eighth memory chips and a memory controller chip according to an exemplary embodiment. Referring to FIGS. 5 and 6, the sixth conduction line CL6 may be connected with the third chip selection pads CSP3 of the first to eighth memory chips 100a_1 to 100b_8. The sixth conduction line CL6 may be fixed by interconnection with the first to eighth memory chips 100a_1 to 100b_8.

Similar to the sixth conduction line CL6, the fourth and fifth conduction lines CL4 and CL5 may be connected with the first and second chip selection pads CSP1 and CSP2 of the first to eighth memory chips 100a_1 to 100b_8, respectively.

Below a method will be described in which a memory controller chip 100b independently selects the first to eighth memory chips 100a_1 to 100b_8. As described with reference to FIG. 2, a chip selection signal CS of a specific memory chip may be generated by ANDing signals output from chip selection pads CSP1 to CSP3. In other words, the chip selection signal CS may be activated when all signals output from chip selection pads CSP1 to CSP3 have a logically high level (e.g., '1').

A signal output from each chip selection pad may be a result obtained by wired-ORing a signal of a normal pad NP and an inverted version of a signal of an inverse pad IP. That is, a signal output from each chip selection pad may be logically high (e.g., '1') when a logically high level (e.g., '1') is applied to a normal pad NP and an inverse pad IP is floated or when a normal pad NP is floated and a logically low level (e.g., '0') is applied to an inverse pad IP.

A chip selection signal CS of a specific memory chip may be activated when normal pads NP are supplied with '1' or floated and inverse pads IP are supplied with '0' or floated. The chip selection signal CS may be inactivated when at least one or more normal pads NP are supplied with '0' or at least one or more inverse pads IP are supplied with '1'.

FIG. 7 is a diagram for describing a relationship between chip selection signals and signals of the first to third chip selection pads of the first to eighth memory chips when output signals of control chip selection pads are '111'. Referring to FIG. 7, a chip selection signal CS of the first memory chip 100a_1 may be activated when '1' is applied to normal pads NP of the first to third chip selection pads CSP1 to CSP3 of the first memory chip 100a_1 and inverse pads IP are floated.

'1' may be supplied to an inverse pad IP of the third chip selection pad CSP3 of the second memory chip 100a_2. '1' may be supplied to an inverse pad IP of the second chip selection pad CSP2 of the third memory chip 100a_3. '1' may be supplied to inverse pads IP of the second and third chip selection pads CSP2 and CSP3 of the fourth memory chip 100a_4. '1' may be supplied to an inverse pad IP of the first chip selection pad CSP1 of the fifth memory chip 100a_5. '1' may be supplied to inverse pads IP of the first and third chip selection pad CSP1 and CSP3 of the sixth memory chip 100a_6. '1' may be supplied to inverse pads IP of the first and second chip selection pad CSP1 and CSP2 of the seventh memory chip 100a_7. '1' may be supplied to inverse pads IP of the first to third chip selection pad CSP1 to CSP3 of the eighth memory chip 100a_8. Accordingly, chip selection signals CS of the second to eighth memory chips 100a_2 to 100a_8 may be inactivated.

FIG. 8 is a diagram for describing relationship between chip selection signals and signals of the first to third chip selection pads of the first to eighth memory chips when output signals of control chip selection pads are '110'. Referring to FIG. 8, '1' may be supplied to normal pads NP of the first and second chip selection pads CSP1 and CSP2 of the second memory chip 100a_2 and '0' may be supplied to an inverse pad IP of the third chip selection pad CSP3 thereof. Accordingly, a chip selection signal CS of the second memory chip 100a_2 may be activated.

'0' may be supplied to normal pads NP of the third chip selection pad CSP3 of the first and third memory chips 100a_1 and 100a_3. '1' may be supplied to an inverse pad IP of the second chip selection pad CSP2 of the fourth memory chip 100a_4. '1' may be supplied to inverse pads IP of the first chip selection pads CSP1 of the fifth to eighth memory chips 100a_5 and 100a_8. Accordingly, chip selection signals CS of the first and third to eighth memory chips 100a_1 and 100a_3 to 100a_8 may be inactivated.

FIG. 9 is a diagram for describing relationship between chip selection signals and signals of the first to third chip selection pads of the first to eighth memory chips when output signals of control chip selection pads are '101'. Referring to FIG. 9, '1' may be supplied to normal pads NP of the first and third chip selection pads CSP1 and CSP3 of the third memory chip 100a_3 and '0' may be supplied to an inverse pad IP of the second chip selection pad CSP2 thereof. Accordingly, a chip selection signal CS of the third memory chip 100a_3 may be activated.

'0' may be supplied to normal pads NP of the second chip selection pad CSP2 of the first and second memory chips 100a_1 and 100a_2. '1' may be supplied to an inverse pad IP of the third chip selection pad CSP3 of the fourth memory chip 100a_4. '1' may be supplied to inverse pads IP of the first chip selection pads CSP1 of the fifth to eighth memory chips 100a_5 and 100a_8. Accordingly, chip selection signals CS of the first, second, and fourth to eighth memory chips 100a_1, 100a_2, and 100a_4 to 100a_8 may be inactivated.

FIG. 10 is a diagram for describing relationship between chip selection signals and signals of the first to third chip selection pads of the first to eighth memory chips when output signals of control chip selection pads are '100'. Referring to FIG. 10, '1' may be supplied to a normal pad NP of the first chip selection pad CSP1 of the fourth memory chip 100a_4 and '0' may be supplied to inverse pads IP of the second and third chip selection pads CSP2 and CSP3. Accordingly, a chip selection signal CS of the fourth memory chip 100a_4 may be activated.

'0' may be supplied to normal pads NP of the second chip selection pad CSP2 of the first and second memory chips 100a_1 and 100a_2. '0' may be supplied to a normal pad NP of the third chip selection pad CSP3 of the third memory chip 100a_3. '1' may be supplied to inverse pads IP of the first chip selection pads CSP1 of the fifth to eighth memory chips 100a_5 to 100a_8. Accordingly, chip selection signals CS of the first, third, and fifth to eighth memory chips 100a_1, 100a_3, and 100a_5 to 100a_8 may be inactivated.

FIG. 11 is a diagram for describing relationship between chip selection signals and signals of the first to third chip selection pads of the first to eighth memory chips when output signals of control chip selection pads are '011'. Referring to FIG. 11, '0' may be supplied to an inverse pad IP of the first chip selection pad CSP1 of the fifth memory chip 100a_5 and '1' may be supplied to normal pads NP of the second and third chip selection pads CSP2 and CSP3 thereof. Accordingly, a chip selection signal CS of the fifth memory chip 100a_5 may be activated.

'0' may be supplied to normal pads NP of the first chip selection pad CSP1 of the first to fourth memory chips 100a_1 to 100a_4. '1' may be supplied to an inverse pad NP of the third chip selection pad CSP3 of the sixth memory chip 100a_6. '1' may be supplied to inverse pads IP of the second chip selection pads CSP2 of the seventh and eighth memory chips 100a_7 and 100a_8. Accordingly, chip selection signals CS of the first, fourth, and sixth to eighth memory chips 100a_1, 100a_4, and 100a_6 to 100a_8 may be inactivated.

FIG. 12 is a diagram for describing relationship between chip selection signals and signals of the first to third chip selection pads of the first to eighth memory chips when output signals of control chip selection pads are '010'. Referring to FIG. 12, '0' may be supplied to inverse pads IP of the first and third chip selection pads CSP1 and CSP3 of the sixth memory chip 100a_6 and '1' may be supplied to a normal pad NP of the second chip selection pad CSP2 thereof. Accordingly, a chip selection signal CS of the sixth memory chip 100a_6 may be activated.

'0' may be supplied to normal pads NP of the first chip selection pad CSP1 of the first to fourth memory chips 100a_1 to 100a_4. '0' may be supplied to a normal pad NP of the third chip selection pad CSP3 of the fifth memory chip 100a_5. '1' may be supplied to inverse pads IP of the second chip selection pads CSP2 of the seventh and eighth memory chips 100a_7 and 100a_8. Accordingly, chip selection signals CS of the first to fifth, seventh, and eighth memory chips 100a_1 to 100a_5, 100a_7, and 100a_8 may be inactivated.

FIG. 13 is a diagram for describing a relationship between chip selection signals and signals of the first to third chip selection pads of the first to eighth memory chips when output signals of control chip selection pads are '001'. Referring to FIG. 13, '0' may be supplied to inverse pads IP of the first and third chip selection pads CSP1 and CSP3 of the seventh memory chip 100a_6 and '1' may be supplied to a normal pad NP of the third chip selection pad CSP3 thereof. Accordingly, a chip selection signal CS of the seventh memory chip 100a_7 may be activated.

'0' may be supplied to normal pads NP of the first chip selection pad CSP1 of the first to fourth memory chips 100a_1 to 100a_4. '0' may be supplied to normal pads NP of the second chip selection pad CSP2 of the fifth and sixth memory chips 100a_5 and 100a_6. '0' may be supplied to normal pads NP of the third chip selection pads CSP2 of the eighth memory chip 100a_8. Accordingly, chip selection signals CS of the first to sixth and eighth memory chips 100a_1 to 100a_6 and 100a_8 may be inactivated.

FIG. 14 is a diagram for describing relationship between chip selection signals and signals of the first to third chip selection pads of the first to eighth memory chips when output signals of control chip selection pads are '000'. Referring to FIG. 14, '0' may be supplied to inverse pads IP of the first to third chip selection pads CSP1 to CSP3 of the eighth memory chip 100a_8. Accordingly, a chip selection signal CS of the eighth memory chip 100a_8 may be activated.

'0' may be supplied to normal pads NP of the first chip selection pad CSP1 of the first to fourth memory chips 100a_1 to 100a_4. '0' may be supplied to normal pads NP of the second chip selection pad CSP2 of the fifth and sixth memory chips 100a_5 and 100a_6. '0' may be supplied to a normal pad NP of the third chip selection pads CSP2 of the seventh memory chip 100a_7. Accordingly, chip selection signals CS of the first to seventh memory chips 100a_1 to 100a_7 may be inactivated.

As described above, when a memory controller chip includes N control chip selection pads, it may output 2N signals having different patterns via control chip selection pads. 2N memory chips may be connected with N conduction lines via N chip selection pads (including N normal pads and N inverse pads) in different patterns. 2N patterns output from the memory controller chip may correspond to 2N memory chips, respectively. Independent selection of the 2N memory chips may be made by outputting N signals having 2N different patterns from the memory controller chip. In other words, memory chips with the same structure may be selected individually using signals of which the number is less than the number of memory chips.

Figure 15:
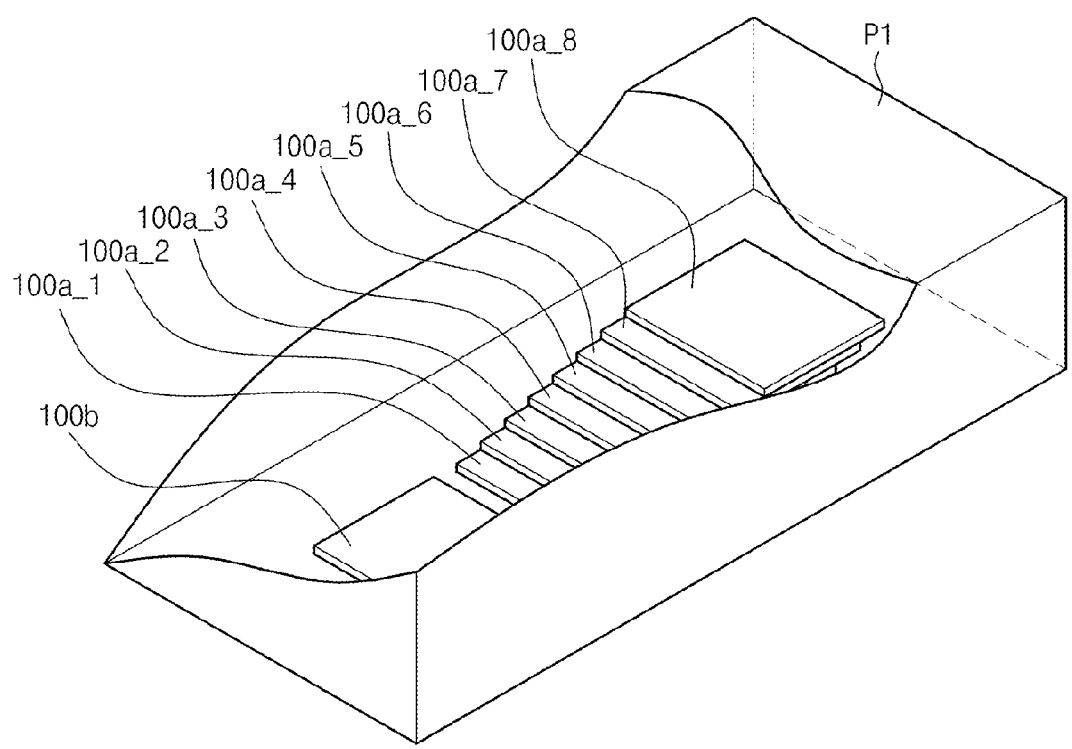
FIG. 15 is a diagram illustrating a semiconductor package according to an exemplary embodiment.

FIG. 15 is a diagram illustrating a semiconductor package according to an exemplary embodiment. Referring to FIG. 15, a semiconductor package P1 may include the first to eighth memory chips 100a_1 to 100a_8 and a memory controller chip 100b. The first to eighth memory chips 100a_1 to 100a_8 may be stacked in a cascade form. Each of the first to eighth memory chips 100a_1 to 100a_8 may have the same structure as a memory chip 100a in FIG. 2. The memory controller chip 100b may have the same structure as a memory controller chip 100b in FIG. 3. The first to eighth memory chips 100a_1 to 100a_8 and the memory controller chip 100b may be connected in the same manner as described in FIGS. 5 and 6.

The memory controller chip 100b may independently select the first to eighth memory chips 100a_1 to 100a_8 using signals of which the number is less than that of the first to eighth memory chips 100a_1 to 100a_8. Each of the first to eighth memory chips 100a_1 to 100a_8 may include at least one or more chip selection pads, and each chip selection pad may include a normal pad and an inverse pad. One of normal and inverse pads in each chip selection pad may be connected with a conduction line, and the other may be floated. The first chip selection pads of the first to eighth memory chips 100a_1 to 100a_8 may share one conduction line, and the first and second chip selection pads of the first to eighth memory chips 100a_1 to 100a_8 may be connected with different conduction lines.

A plurality of nodes (not shown) may be provided at the semiconductor package P1. For example, the plurality of nodes may be a plurality of solder balls or a plurality of pins. The plurality of nodes may be electrically connected with the first memory chip 100a_1 or the eighth memory chip 100a_8. The semiconductor package P1 may exchange signals with an external device via the plurality of nodes.

Figure 16:
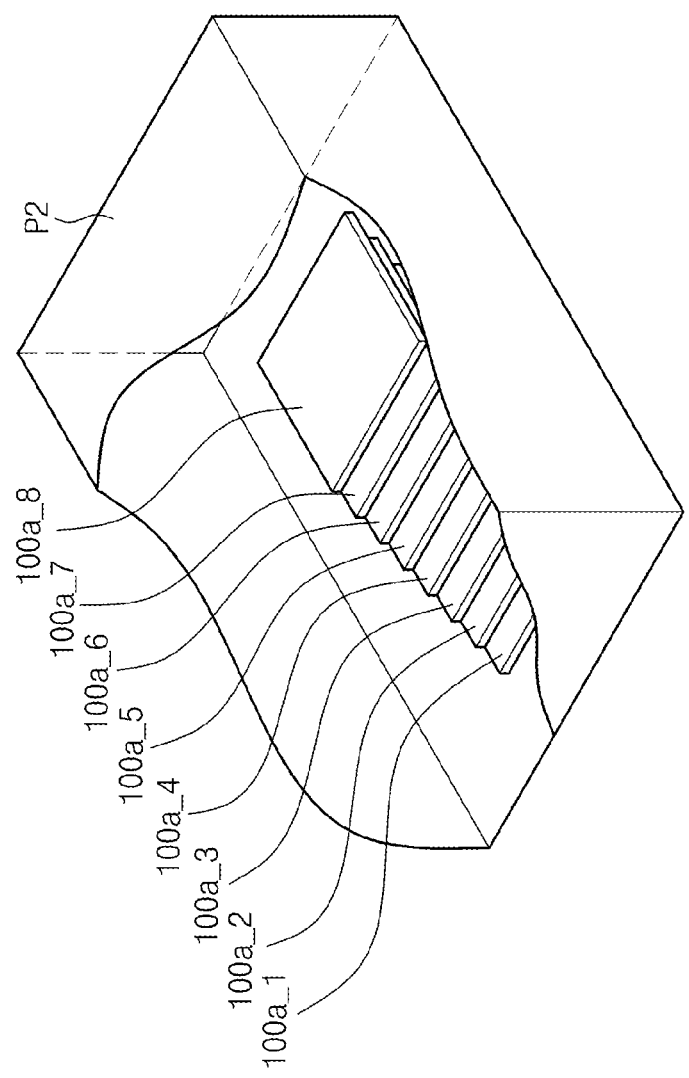
FIGS. 16 and 17 are diagrams of a semiconductor package according to another exemplary embodiment.
Figure 17:
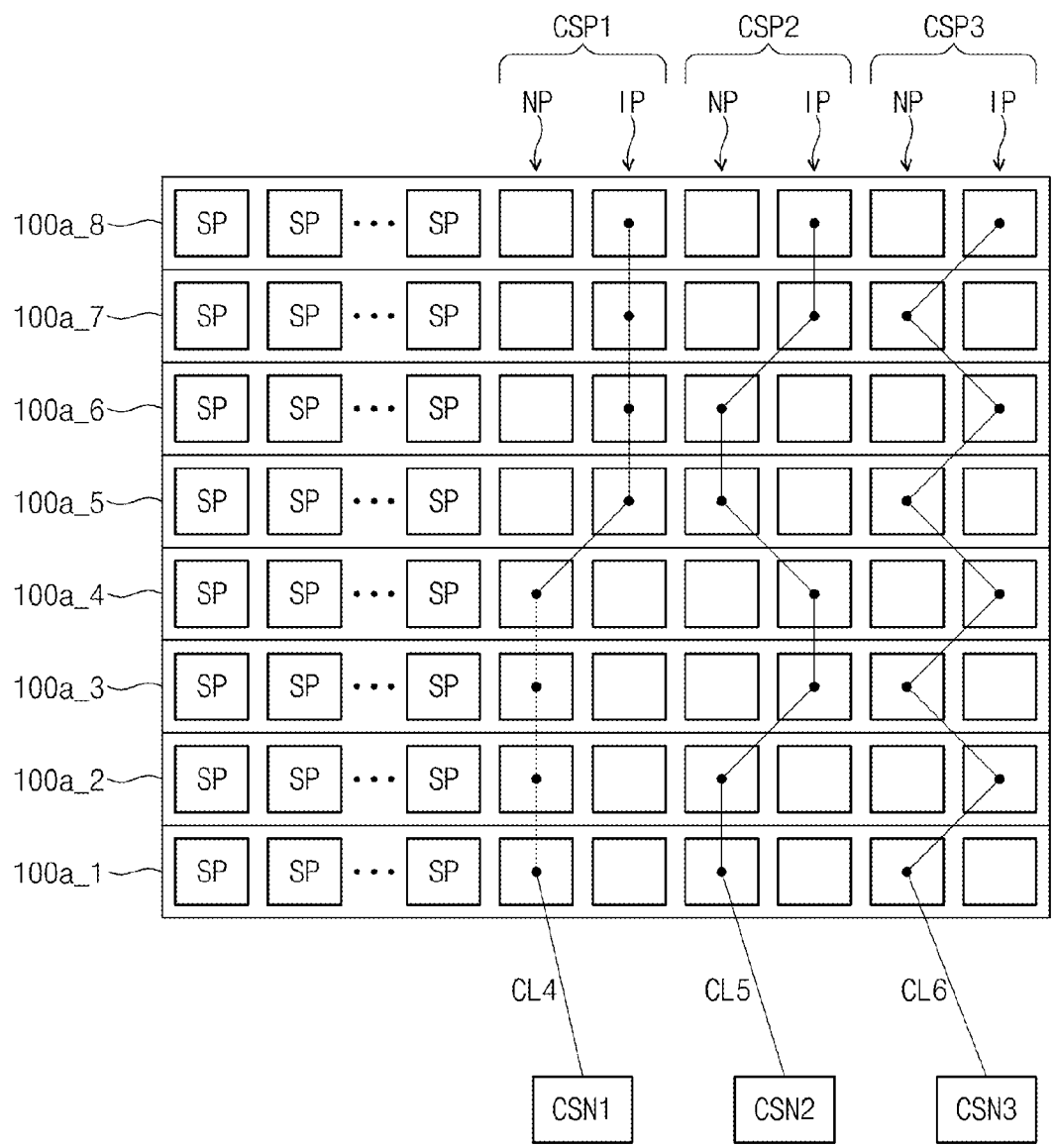

FIGS. 16 and 17 are diagrams a semiconductor package according to another exemplary embodiment. A semiconductor package P2 in FIG. 16 may include the first to eighth memory chips 100a_1 to 100a_8 stacked as compared with a semiconductor package P1 in FIG. 15.

The first to third chip selection nodes CSN1 to CSN3 may be provided at the semiconductor package P2. The fourth to sixth conduction lines CL4 to CL6 may be connected with the first to third chip selection nodes CSN1 to CSN3, respectively. The semiconductor package P2 may further include signal and power nodes connected with signal and power pads SP via conduction lines (not shown).

Figure 18:
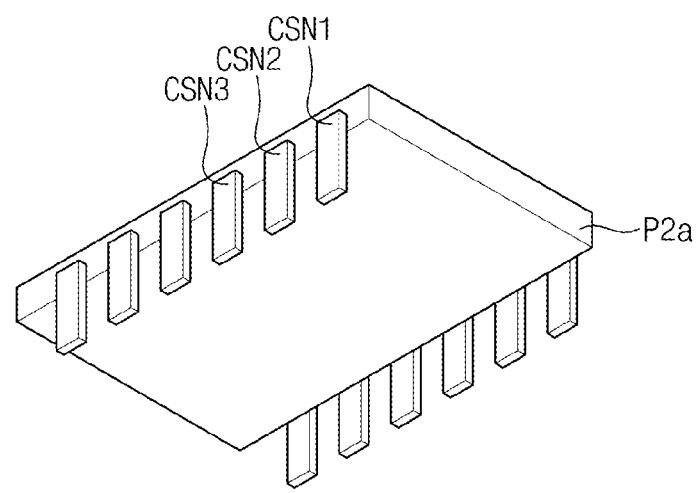
FIG. 18 is a diagram illustrating a semiconductor package including nodes according to an exemplary embodiment.

FIG. 18 is a diagram illustrating a semiconductor package including nodes according to an exemplary embodiment. Referring to FIGS. 16 and 18, nodes may be pins. A part of the plurality of pins may be assigned to the first to third chip selection nodes CSN1 to CSN3. The remaining thereof may be electrically connected with signal and power pads SP.

Figure 19:
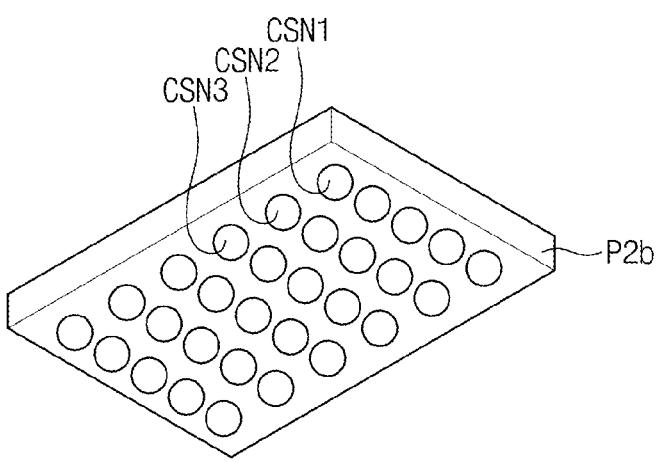
FIG. 19 is a diagram illustrating a semiconductor package including nodes according to another exemplary embodiment.

FIG. 19 is a diagram illustrating a semiconductor package including nodes according to another exemplary embodiment. Referring to FIGS. 16, 17, and 19, nodes may be solder balls. A part of the plurality of solder balls may be assigned to the first to third chip selection nodes CSN1 to CSN3. The remaining thereof may be electrically connected with signal and power pads SP.

Figure 20:
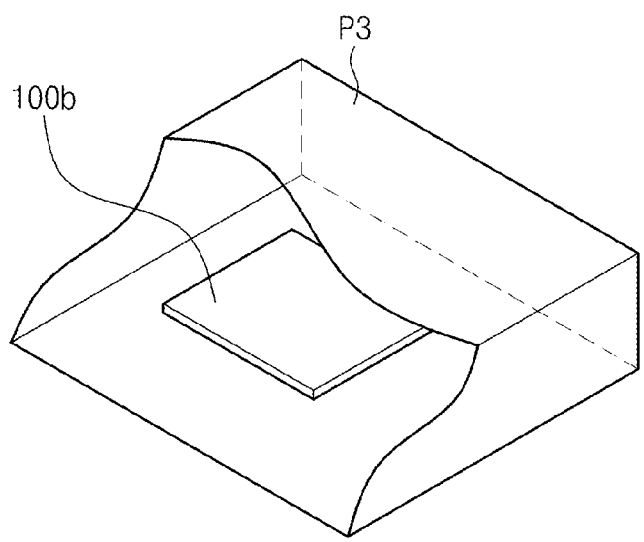
FIGS. 20 and 21 are diagrams illustrating a semiconductor package according to still another exemplary embodiment.
Figure 21:
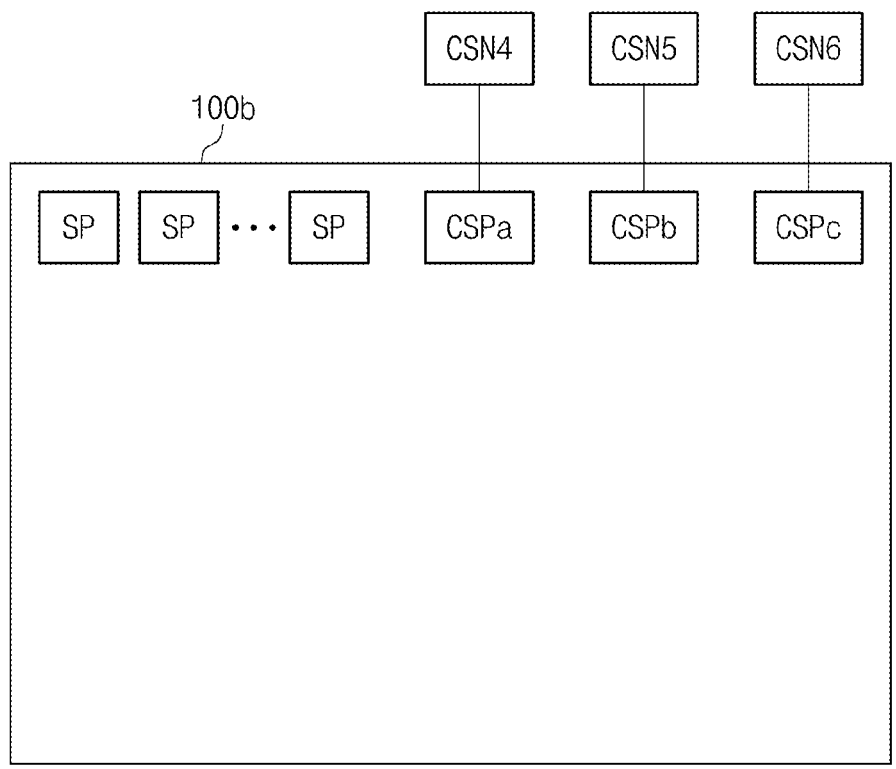

FIGS. 20 and 21 are diagrams illustrating a semiconductor package according to still another exemplary embodiment. A semiconductor package P3 may include a memory controller chip 100b as compared with a semiconductor package P1 in FIG. 15.

The semiconductor package P3 may include the fourth to sixth chip selection nodes CSN4 and CSN6. The fourth to sixth chip selection nodes CSN4 and CSN6 may be electrically connected with control chip selection pads CSPa to CSPc, respectively. Signal and power nodes may be further provided which are connected with conduction lines (not shown) via signal and power pads SP.

As described with reference to FIG. 18, nodes of the semiconductor package P3 may be a plurality of pins. A part of the plurality of pins may be assigned to the fourth to sixth chip selection nodes CSN4 and CSN6. The remaining thereof may be electrically connected with signal and power pads SP.

As described with reference to FIG. 19, nodes of the semiconductor package P3 may be a plurality of solder balls. A part of the plurality of solder balls may be assigned to the fourth to sixth chip selection nodes CSN4 and CSN6. The remaining thereof may be electrically connected with signal and power pads SP.

Figure 22:
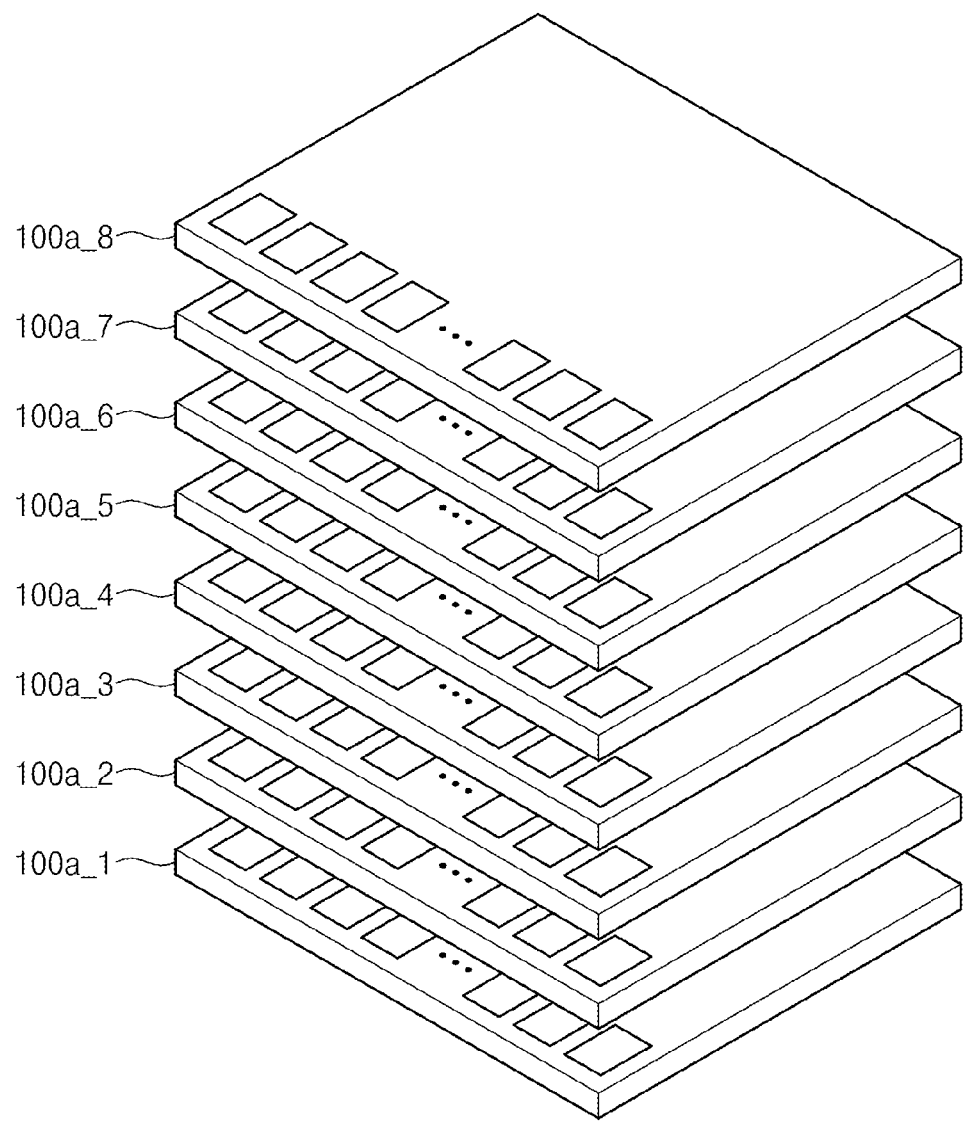
FIG. 22 is a diagram illustrating a stacked structure of memory chips according to another exemplary embodiment.

FIG. 22 is a diagram illustrating a stacked structure of memory chips according to another exemplary embodiment. Referring to FIG. 22, memory chips 100a_1 to 100a_8 may be stacked a direction perpendicular to the memory chips 100a_1 to 100a_8. For example, the memory chips 100a_1 to 100a_8 may be stacked to have a vertical pillar shape. A space may be provided between a lower-layer memory chip and an upper-layer memory chip. For example, a space to be filled by an insulation material may be provided between a lower-layer memory chip and an upper-layer memory chip.

Each of the memory chips 100a_1 to 100a_8 may have the same structure as a memory chip 100a described with reference to FIG. 2. Each of the memory chips 100a_1 to 100a_8 may include the first, second, and third chip selection pads CSP1, CSP2, and CSP3, each of which includes a normal pad NP and an inverse pad IP.

The number of stacked memory chips is not limited to this disclosure. For ease of description, it is assumed that eight memory chips 100a_1 to 100a_8 are stacked.

Figure 23:
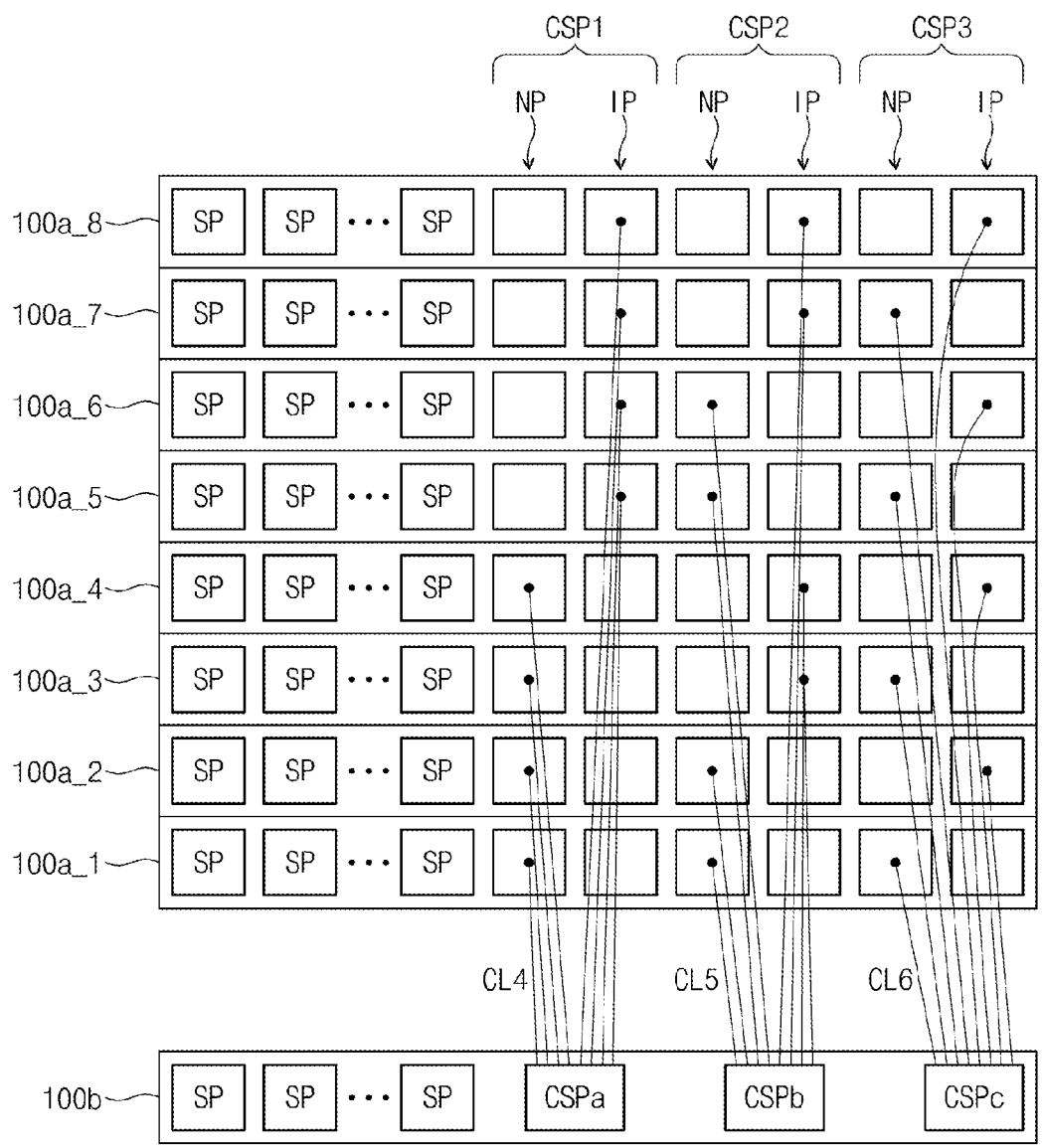
FIG. 23 is a diagram illustrating an interconnection structure between stacked memory chips and a memory controller chip according to another exemplary embodiment.

FIG. 23 is a diagram illustrating an interconnection structure between stacked memory chips and a memory controller chip according to another exemplary embodiment. In an exemplary embodiment, for ease of description, memory chips 100a_1 to 100a_8 are illustrated as a cascade shape.

Referring to FIG. 23, ones of normal and inverse pads NP and iP of the first chip selection pads CSP1 of the first to eighth memory chips 100a_1 to 100a_8 may be connected with the fourth conduction lines CL4, and the others may be floated. The first chip selection pads CSP1 may be connected with the fourth conduction lines CL4 in the same patterns as described with reference to FIG. 5.

Normal pads NP or inverse pads IP of the second chip selection pads CSP2 of the first to eighth memory chips 100a_1 to 100a_8 may be connected with the fifth conduction lines CL5, and the inverse pads IP or the normal pads NP thereof may be floated. The second chip selection pads CSP2 may be connected with the fifth conduction lines CL5 in the same patterns as described with reference to FIG. 5.

Normal pads NP or inverse pads IP of the third chip selection pads CSP3 of the first to eighth memory chips 100a_1 to 100a_8 may be connected with the sixth conduction lines CL6, and the inverse pads IP or the normal pads NP thereof may be floated. The third chip selection pads CSP3 may be connected with the sixth conduction lines CL6 in the same patterns as described with reference to FIG. 5.

The fourth conduction lines CL4 may be connected in common with a control chip selection pad CSPa of a memory controller chip 100b. The fifth conduction lines CL5 may be connected in common with a control chip selection pad CSPb of the memory controller chip 100b. The sixth conduction lines CL6 may be connected in common with a control chip selection pad CSPc of the memory controller chip 100b.

The first to eighth memory chips 100a_1 to 100a_8 may be selected individually in the same manner as described with reference to FIGS. 7 to 14.

Figure 24:
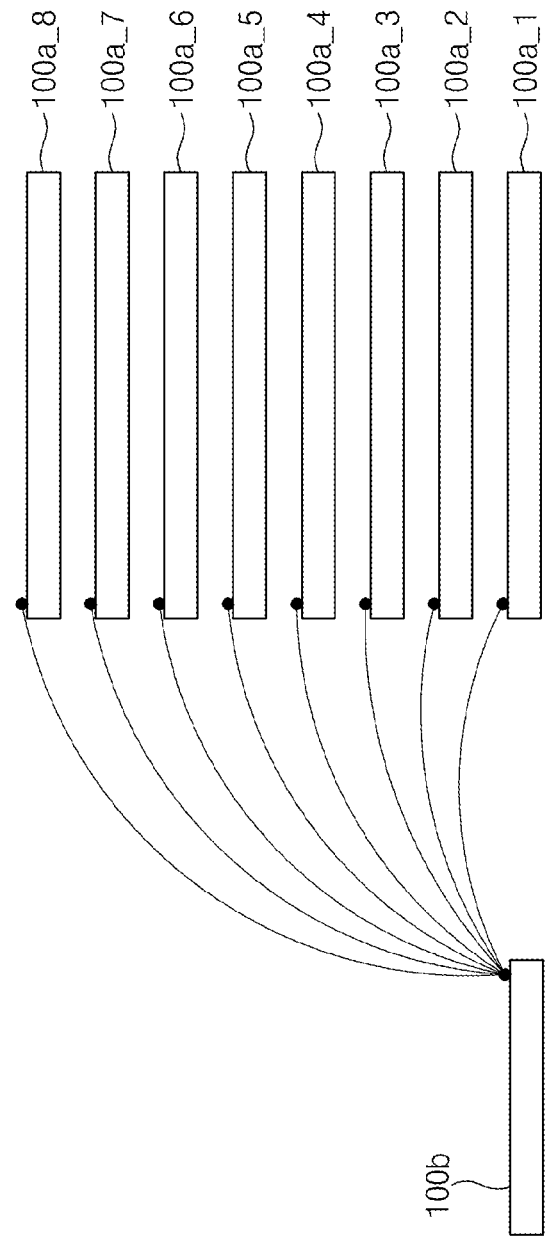
FIG. 24 is a diagram illustrating a lateral view of the first to eighth memory chips and a memory control chip.

FIG. 24 is a diagram illustrating a lateral view of the first to eighth memory chips and a memory control chip. Referring to FIGS. 23 and 24, the sixth conduction lines CL6 may be coupled with the third chip selection pads CSP3 of the first to eighth memory chips 100a_1 to 100a_8, respectively.

Like the sixth conduction lines CL6, the fourth conduction lines CL4 may be coupled with the first chip selection pads CSP1 of the first to eighth memory chips 100a_1 to 100a_8, respectively. The fifth conduction lines CL5 may be coupled with the second chip selection pads CSP2 of the first to eighth memory chips 100a_1 to 100a_8, respectively.

Figure 25:
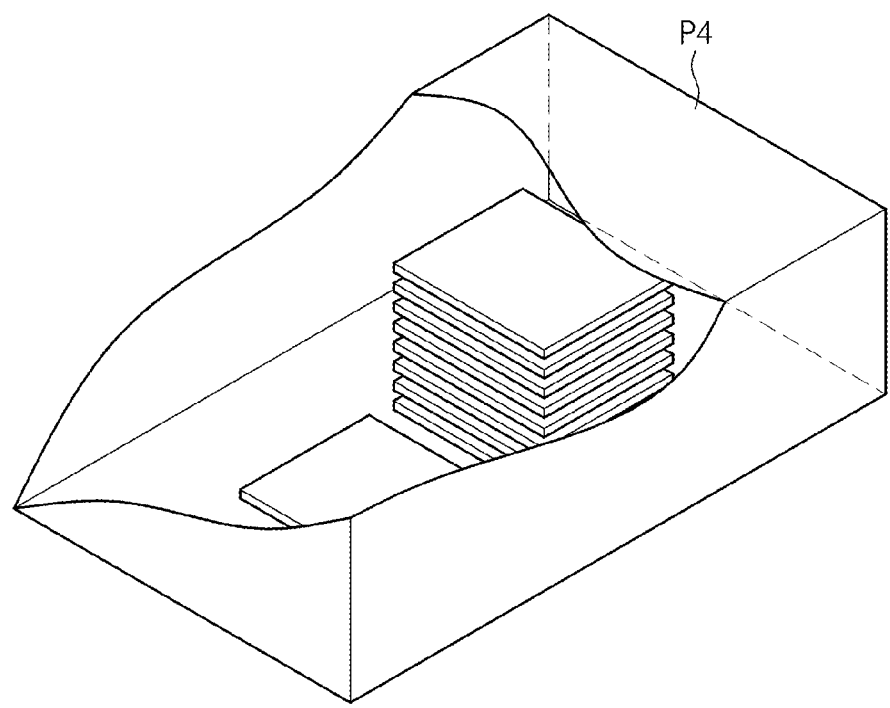
FIG. 25 is a diagram illustrating a semiconductor package according to still another exemplary embodiment.

FIG. 25 is a diagram illustrating a semiconductor package according to still another exemplary embodiment. Referring to FIG. 25, a semiconductor package P4 may include the first to eighth memory chips 100a_1 to 100a_8 and a memory controller chip 100b. Each of the first to eighth memory chips 100a_1 to 100a_8 may have the same structure as a memory chip 100a in FIG. 2. The first to eighth memory chips 100a_1 to 100a_8 may be stacked to have a vertical pillar shape. The memory controller chip 100b may have the same structure as a memory controller chip 100b in FIG. 3. The first to eighth memory chips 100a_1 to 100a_8 and the memory controller chip 100b may be connected the same as described with reference to FIGS. 23 and 24.

The memory controller chip 100b may independently select the first to eighth memory chips 100a_1 to 100a_8 using signals of which the number is less than that of the first to eighth memory chips 100a_1 to 100a_8. Each of the first to eighth memory chips 100a_1 to 100a_8 may include at least one or more chip selection pads, each of which includes a normal pad and an inverse pad. One of normal and inverse pads of each chip selection pad may be connected with a conduction line, and the other may be floated.

A plurality of nodes (not shown) may be provided at the semiconductor package P4. For example, the nodes may be solder balls or pins. The nodes may be electrically connected with the first to eighth memory chips 100a_1 to 100a_8 or the memory controller chip 100b. The semiconductor package P4 may exchange signals with an external device via the nodes.

Figure 26:
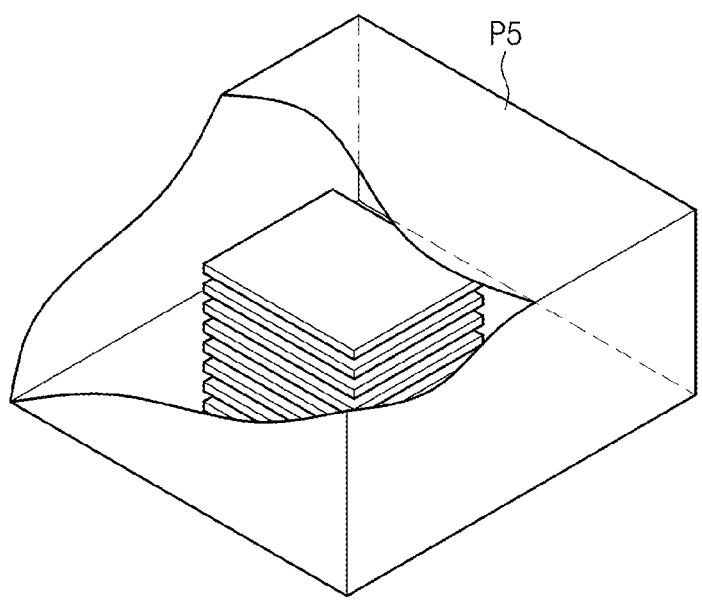
FIGS. 26 and 27 are diagrams illustrating a semiconductor package according to still another exemplary embodiment.
Figure 27:
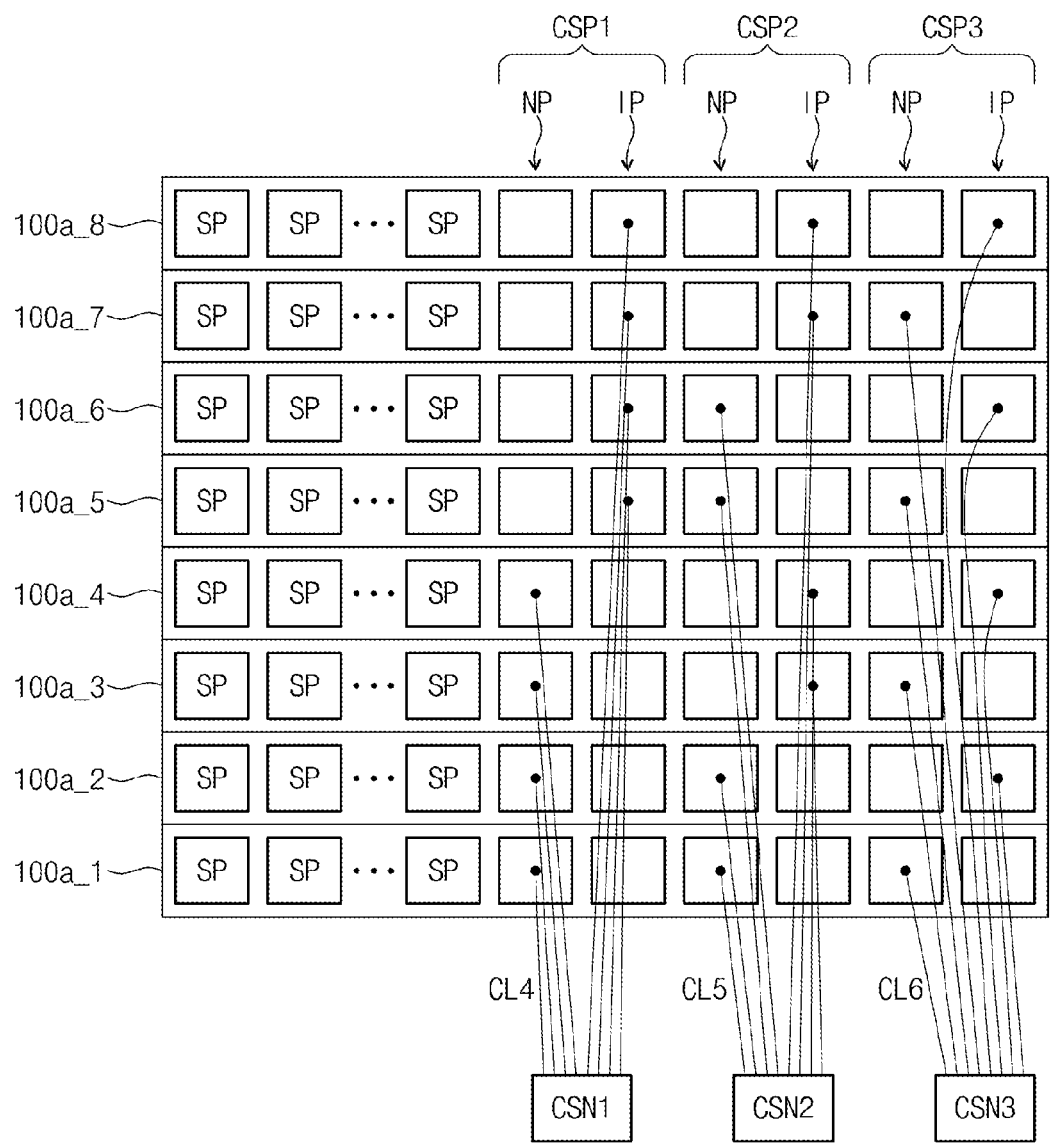

FIGS. 26 and 27 are diagrams illustrating a semiconductor package according to still another exemplary embodiment. A semiconductor package P5 in FIG. 26 may include stacked memory chips 100a_1 to 100a_8 as compared with a semiconductor package P4 in FIG. 25.

The semiconductor package P5 may include the first to thirdchip selection nodes CSN1 and CSN3. The fourth conduction lines CL4 may be connected with the first chip selection node CSN1, the fifth conduction lines CL5 may be connected with the second chip selection node CSN2, and the sixth conduction lines CL6 may be connected with the third chip selection node CSN3. Signal and power nodes may be further provided which are connected with signal and power pads SP via conduction lines (not shown).

As described with reference to FIG. 18, nodes of the semiconductor package P5 may be a plurality of pins. A part of the plurality of pins may be assigned to the first to thirdchip selection nodes CSN1 and CSN3. The remaining thereof may be electrically connected with signal and power pads SP.

As described with reference to FIG. 19, nodes of the semiconductor package P5 may be a plurality of solder balls. A part of the plurality of solder balls may be assigned to the first to third chip selection nodes CSN1 and CSN3. The remaining thereof may be electrically connected with signal and power pads SP.

Figure 28:
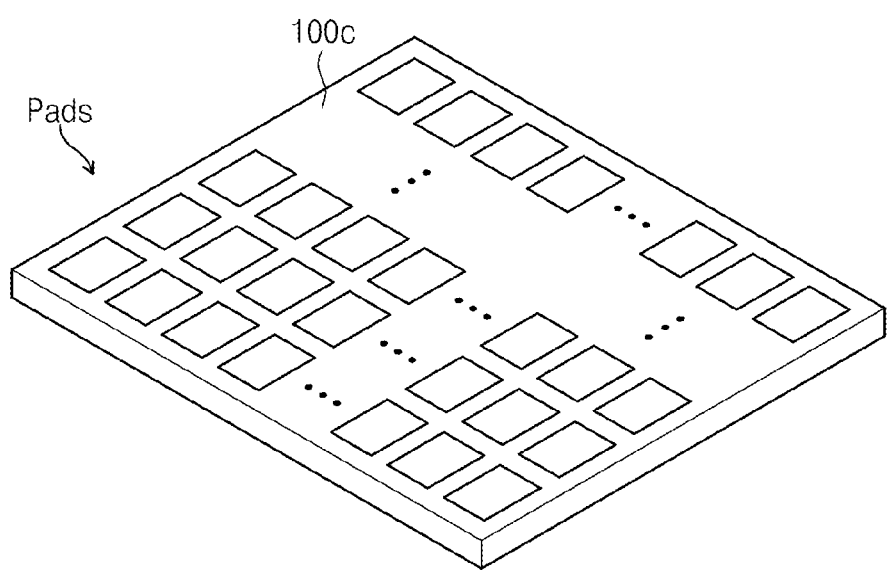
FIG. 28 is a diagram illustrating a semiconductor chip according to another exemplary embodiment.

FIG. 28 is a diagram illustrating a semiconductor chip according to another exemplary embodiment. Referring to FIG. 28, a semiconductor chip 100c may include a plurality of pads, which are provided on an entire upper surface of the semiconductor chip 100c. The semiconductor chip 100c may include a memory chip or a non-memory chip. The non-memory chip may include a memory controller chip configured to control a memory chip.

Figure 29:
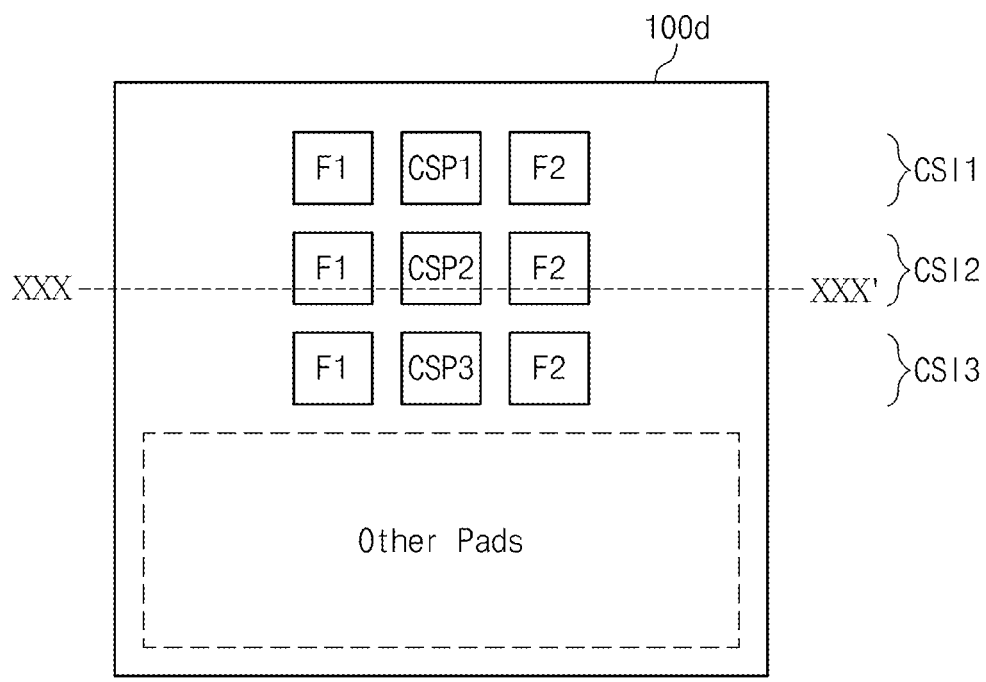
FIG. 29 is a diagram illustrating a memory chip according to another exemplary embodiment.
Figure 30:
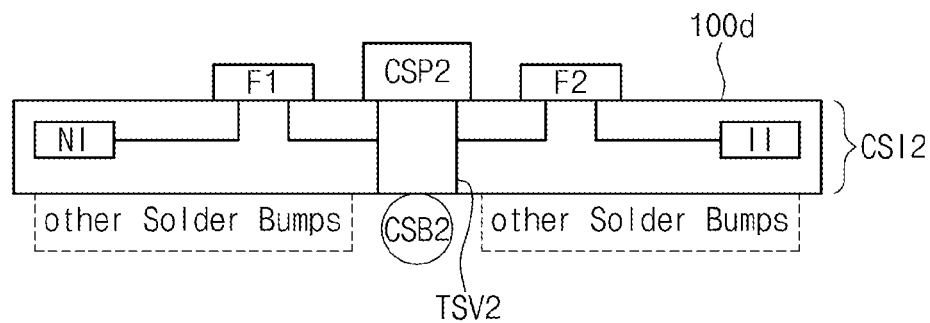
FIG. 30 is a cross-section view taken along a line XXX-XXX' in FIG. 29.

FIG. 29 is a diagram illustrating a memory chip according to another exemplary embodiment. FIG. 30 is a cross-section view taken along a line XXX-XXX' in FIG. 29. Referring to FIGS. 29 and 30, the first to third chip selection inputs CSI1 to CSI3 may be provided to a memory chip 100d.

The second chip selection input CSI2 may include the second chip selection pad CSP2 provided on an upper surface of the memory chip 100d, the second chip selection solder bump CSB2 provided on a lower surface of the memory chip 100d, the second through silicon via TSV2 formed to passing through the memory chip 100d and electrically connecting the second chip selection pad CSP2 and the second chip selection solder bump CSB2, the first and second fuses F1 and F2 provided on an upper surface of the memory chip 100d and each electrically connected with the second through silicon via TSV2, and normal and inverse inputs NI and II each connected with the first and second fuses F1 and F2.

The first and third chip selection inputs CSI1 and CSI3 may have the same structure as the second chip selection input CSI2.

The first and second fuses F1 and F2 may be a laser fuse or an electric fuse. The first and second fuses F1 and F2 may be formed to be buried at the memory chip 100d and to expose an upper surface. The first and second fuses F1 and F2 may be formed to be buried in the memory chip 100d.

The first to third chip selection solder bumps CSB1 to CSB3 and the first to third chip selection pads CSP1 to CSP3 may not be connected directly via the first to third through silicon vias TSV1 to TSV3. In an exemplary embodiment, the first to third chip selection solder bumps CSB1 to CSB3 and the first to third chip selection pads CSP1 to CSP3 may be electrically connected via conduction lines, respectively. The first to third chip selection pads CSP1 to CSP3 and the first to third through silicon vias TSV1 to TSV3 may be electrically connected via conduction lines, respectively.

Other than the first to third chip selection pads CSP1 to CSP3, pads may be further provided on the upper surface of the memory chip 100d. The pads may be provided on an entire upper surface of the memory chip 100d.

Other than the first to third chip selection solder bumps CSB1 to CSB3, solder bumps may be further provided on the upper surface of the memory chip 100d. The solder bumps may be provided on an entire lower surface of the memory chip 100d.

The number of chip selection inputs CSI1 to CSI3 provided to the memory chip 100d is not limited to this disclosure.

Figure 31:
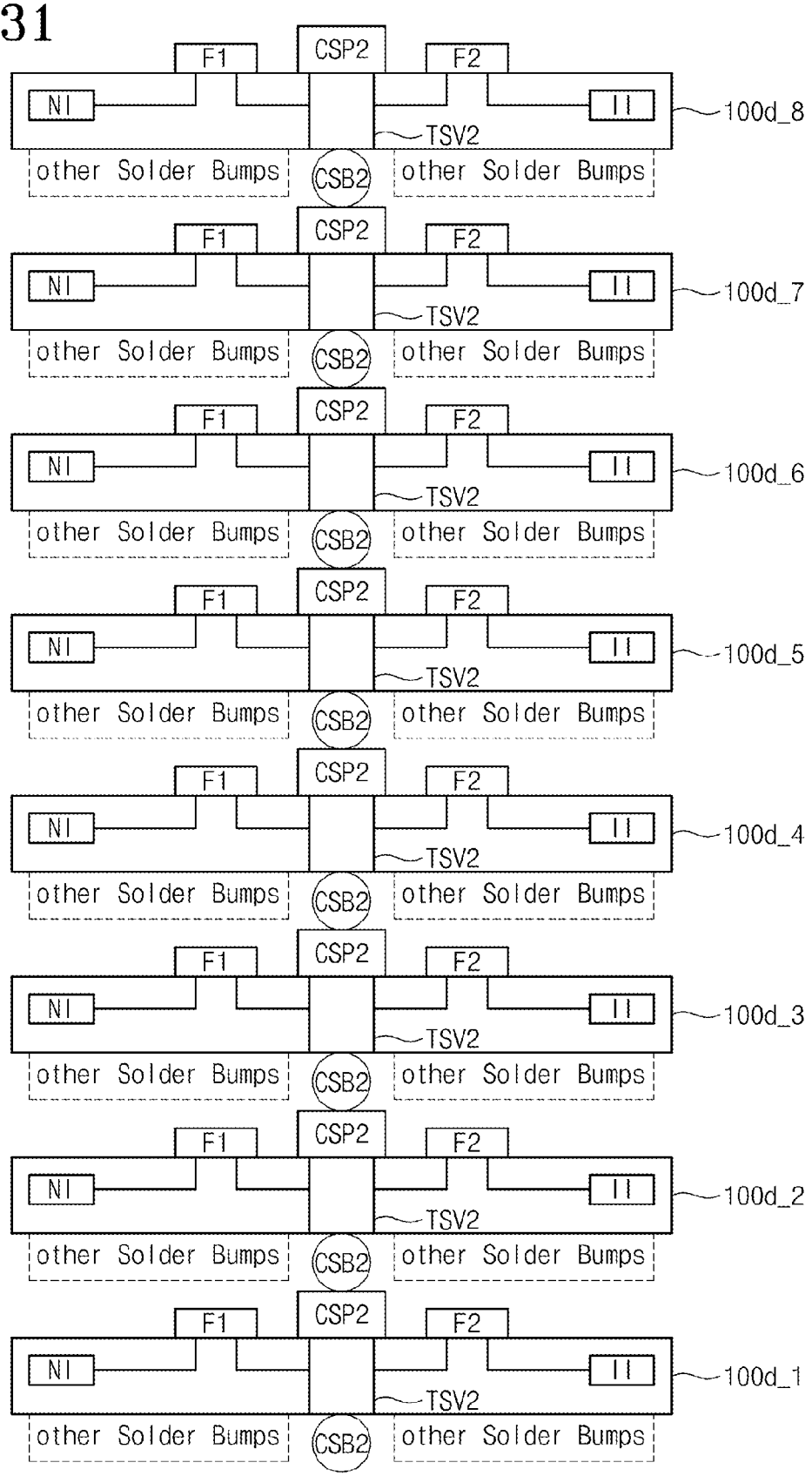
FIG. 31 is a diagram illustrating a stacked structure of memory chips according to still another exemplary embodiment.

FIG. 31 is a diagram illustrating a stacked structure of memory chips according to still another exemplary embodiment. Referring to FIG. 31, a plurality of memory chips 100d_1 to 100d_8 may be stacked in a vertical pillar shape. For example, the first to eighth memory chips 100d_1 to 100d_8 may be stacked. The number of stacked memory chips is not limited.

Each of the first to eighth memory chips 100d_1 to 100d_8 may have the same structure as a memory chip 100d in FIG. 30. Chip selection pads CSP1 to CSP3 of a lower-layer memory chip may be connected with chip selection solder bumps CSB1 to CSB3 of an upper-layer memory chip, respectively.

The first chip selection solder bumps CSB1, the first through silicon vias TSV1, and the first chip selection pads CSP1 of the first to eighth memory chips 100d_1 to 100d_8 may be interconnected electrically. The second chip selection solder bumps CSB2, the second through silicon vias TSV2, and the second chip selection pads CSP2 of the first to eighth memory chips 100d_1 to 100d_8 may be interconnected electrically. The third chip selection solder bumps CSB3, the third through silicon vias TSV3, and the third chip selection pads CSP3 of the first to eighth memory chips 100d_1 to 100d_8 may be interconnected electrically.

In each memory chip, one of the first and second fuses F1 and F2 may be cut, and the other may not be cut. In each memory chip, the first fuse F1 may be cut. At this time, a normal input NI in each memory chip may be floated, and a signal may be transferred to an inverse input II. In each memory chip, the second fuse F2 can be cut. At this time, a signal may be transferred to the normal input NI of each memory chip, and an inverse input II thereof may be floated.

The first to third chip selection solder bumps CSB1 to CSB3, the first to third through silicon vias TSV1 to TSV3, the first to third chip selection pads CSP1 to CSP3, and the first and second fuses F1 and F2 may correspond to the fourth to sixth conduction lines CL4 to CL6 in FIG. 5. The normal inputs NI and the inverse inputs II may correspond to normal pads NP and inverse pads IP in FIG. 5.

As described with reference to FIG. 2, a normal input NI of each chip selection input may be connected with the first conduction line CL1, an inverse input II thereof may be connected with the second conduction line CL2 via an inverter INV. The first and second conduction lines CL1 and CL2 may be connected with the third conduction line CL3. The third conduction lines CL3 of each memory chip may be applied to a logic gate LG. An output of the logic gate LG may be used as a chip selection signal CS.

As described with reference to FIGS. 7 to 14, signals with various patterns may be transferred via the first to third chip selection solder bumps CSB1 to CSB3, the first to third through silicon vias TSV1 to TSV3, and the first to third chip selection pads CSP1 to CSP3. The first to eighth memory chips 100d_1 to 100d_8 may be selected independently according signal patterns.

As described with reference to FIG. 25, the first to eighth memory chips 100d_1 to 100d_8 may constitute a semiconductor package with a memory controller chip 100b. Control chip selection pads CSPa to CSPc of the memory controller chip 100b may be connected electrically with the first to third chip selection solder bumps CSB1 to CSB3, respectively.

As described with reference to FIG. 26, the first to eighth memory chips 100d_1 to 100d_8 may constitute a semiconductor package. Chip selection nodes of the semiconductor package may be electrically connected with the first to third chip selection solder bumps CSB1 to CSB3 of the first memory chip 100d_1, respectively.

Figure 32:
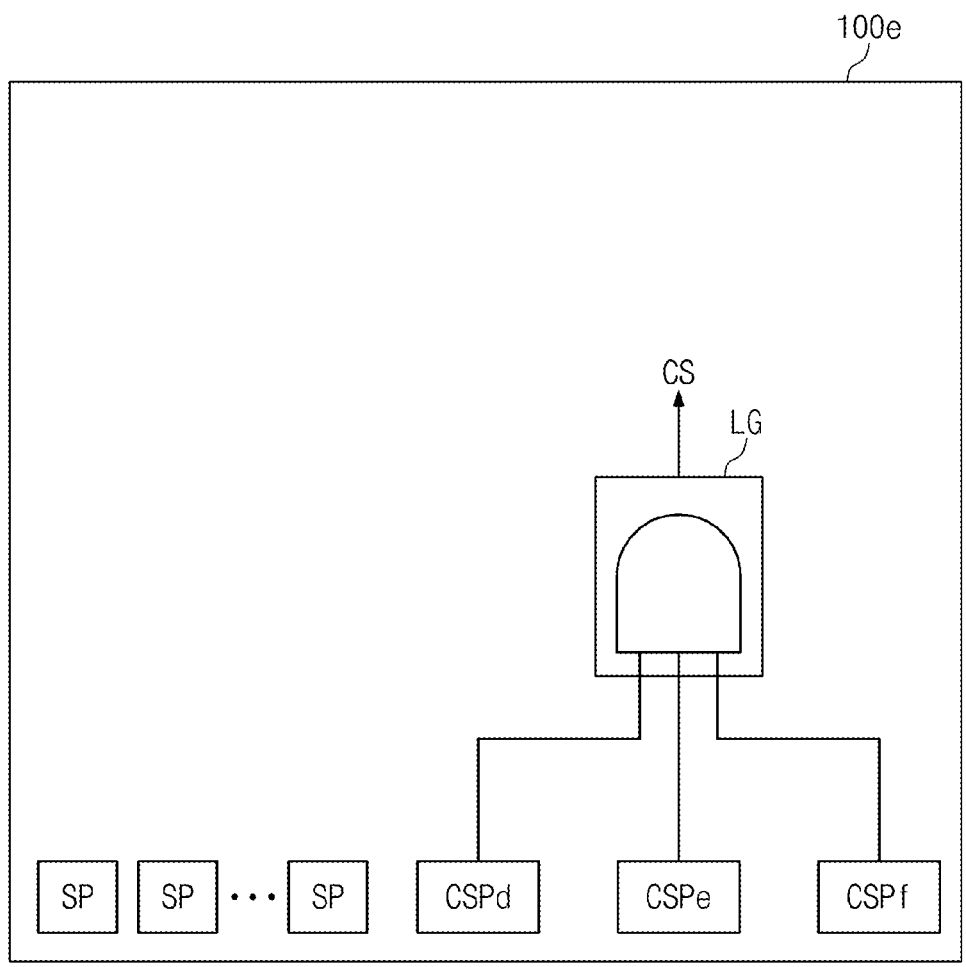
FIG. 32 is a diagram illustrating a memory chip according to still another exemplary embodiment.

FIG. 32 is a diagram illustrating a memory chip according to still another exemplary embodiment. Referring to FIG. 32, as described with reference to FIG. 1, pads may be provided on a part of an upper surface of a memory chip 100e.

The memory chip 100e may include a plurality of signal and power pads SP, a plurality of chip selection pads CSPd to CSPf, and a logic gate LG. The logic gate LG may be configured to AND signals of the chip selection pads CSPd to CSPf. An output of the logic gate LG may be a chip selection signal CS.

Figure 33:
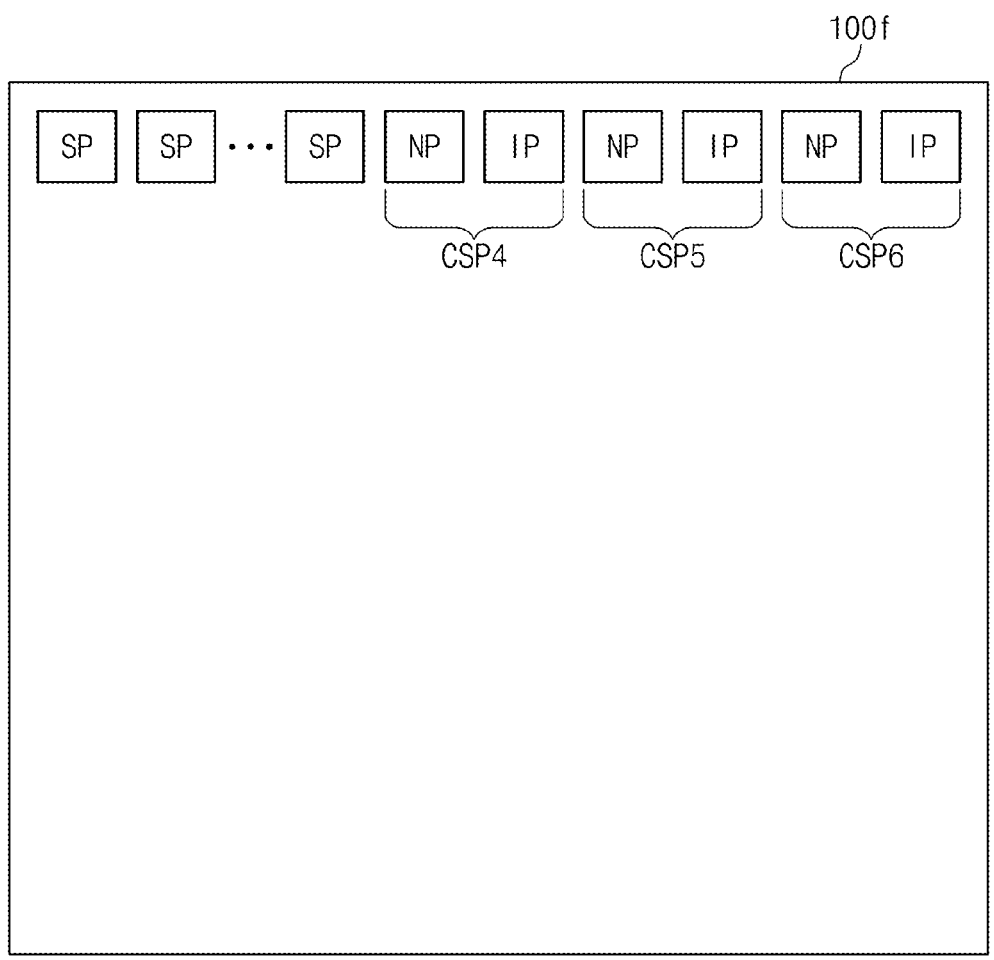
FIG. 33 is a diagram illustrating a memory controller chip according to another exemplary embodiment.

FIG. 33 is a diagram illustrating a memory controller chip according to another exemplary embodiment. Referring to FIG. 33, a memory controller chip 100f may include a plurality of signal and power pads SP and a plurality of chip selection pads CSP4 to CSP6. Each of the chip selection pads CSP4 to CSP6 may include a normal pad NP and an inverse pad IP. A differential signal may be output via the normal and inverse pads NP and IP of each control chip selection pad.

Figure 34:
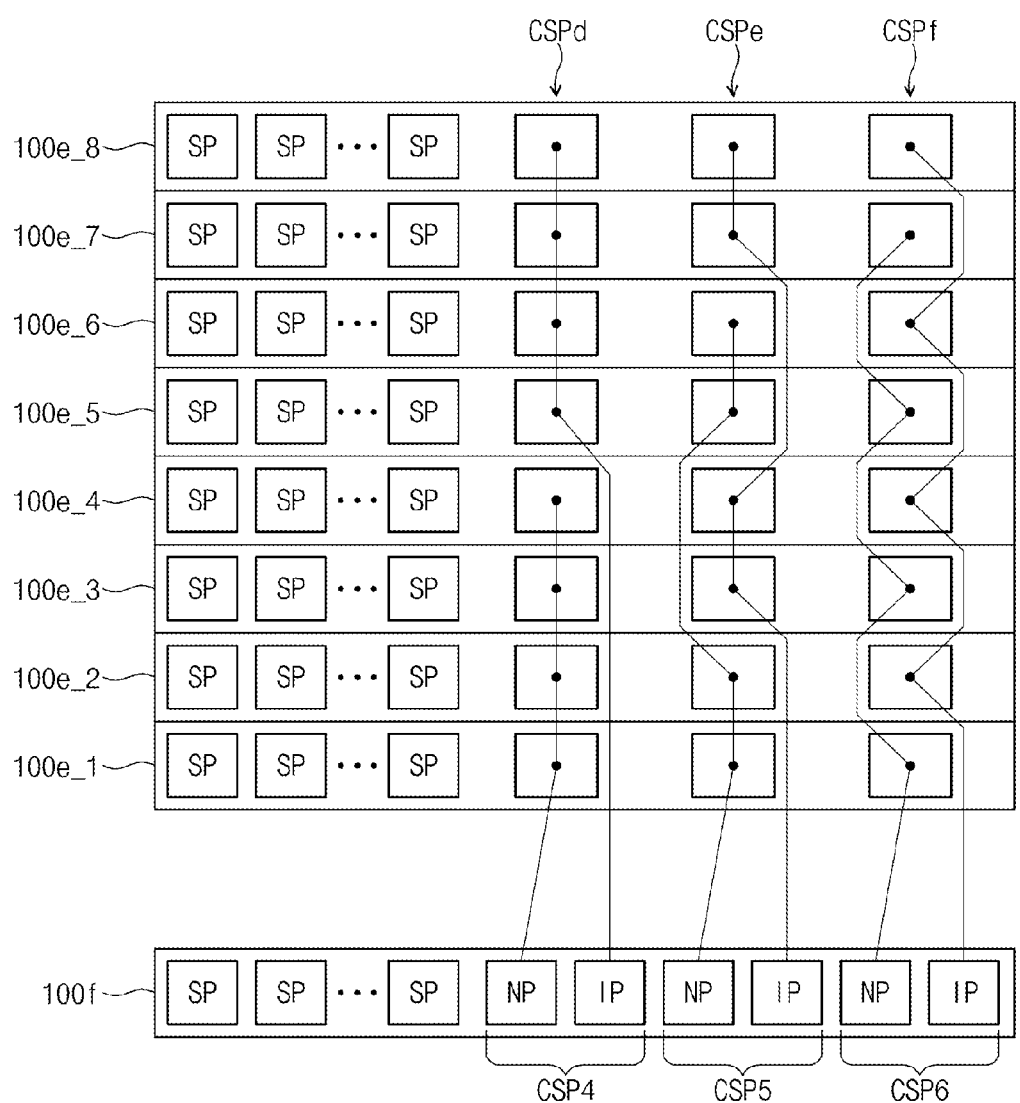
FIG. 34 is a diagram illustrating an interconnection structure between memory chips and a memory controller chip according to still another exemplary embodiment.

FIG. 34 is a diagram illustrating an interconnection structure between memory chips and a memory controller chip according to still another exemplary embodiment. As described with reference to FIG. 4, a plurality of memory chips 100e_1 to 100e_8 may be stacked in a cascade shape, exemplarily Referring to FIG. 34, specific chip selection pads of the first to eighth memory chips 100e_1 to 100e_8 may be electrically connected with a specific control chip selection pad of a memory controller chip 100f. A part of specific chip selection pads may be electrically connected with a normal pad NP of a specific control chip selection pad, and the remaining thereof may be electrically connected with an inverse pad IP. Chip selection pads connected with the normal pad NP may be connected in common with the normal pad NP via one conduction line. Chip selection pads connected with the inverse pad IP may be connected in common with the inverse pad IP via one conduction line. In other words, conduction lines for connecting the first to eighth memory chips 100e_1 to 100e_8 and the memory controller chip 100f may be fixed by the first to eighth memory chips 100e_1 to 100e_8.

The first to eighth memory chips 100e_1 to 100e_8 may be electrically connected with the fourth to sixth control chip selection pads CSP4 to CSP6 including normal pads NP and inverse pads IP of the memory controller chip 100f via different patterns.

Each memory chip may output a chip selection signal CS by ANDing signals of the chip selection pads CSPd to CSPf. If '1' is applied to at least one of the chip selection pads CSPd to CSPf, the chip selection signal CS may be inactivated.

The memory controller chip 100f may output signals with various patterns via normal pads NP of the fourth to sixth control chip selection pads CSP4 to CSP6. Inverted versions of signals output via the normal pads NP may be output via inverse pads IP.

The first to eighth memory chips 100e_1 to 100e_8 may be selected individually in the same manner as described with reference to FIGS. 7 to 14. In an exemplary embodiment, when normal pads NP of the fourth to sixth control chip selection pads CSP4 to CSP6 are supplied with '111', the first memory chip 100e_1 may be selected. The second to eighth memory chips 100e_2 to 100e_8 may be selected when '110', '101', '100', '011', '010', '001', and '000' are applied to the normal pads NP, respectively.

N signals may have 2N different patterns. 2N memory chips may be selected independently using N signal lines. In other words, memory chips may be independently selected using signals of which the number is less than that of memory chips.

As described with reference to FIG. 15, the first to eighth memory chips 100e_1 to 100e_8 may constitute a semiconductor package with the memory controller chip 100f. The first to eighth memory chips 100e_1 to 100e_8 and the memory controller chip 100f may be interconnected as illustrated in FIG. 34.

As described with reference to FIG. 16, the first to eighth memory chips 100e_1 to 100e_8 may constitute a semiconductor package. As illustrated in FIG. 20, the memory controller chip 100f may form a semiconductor package.

Figure 35:
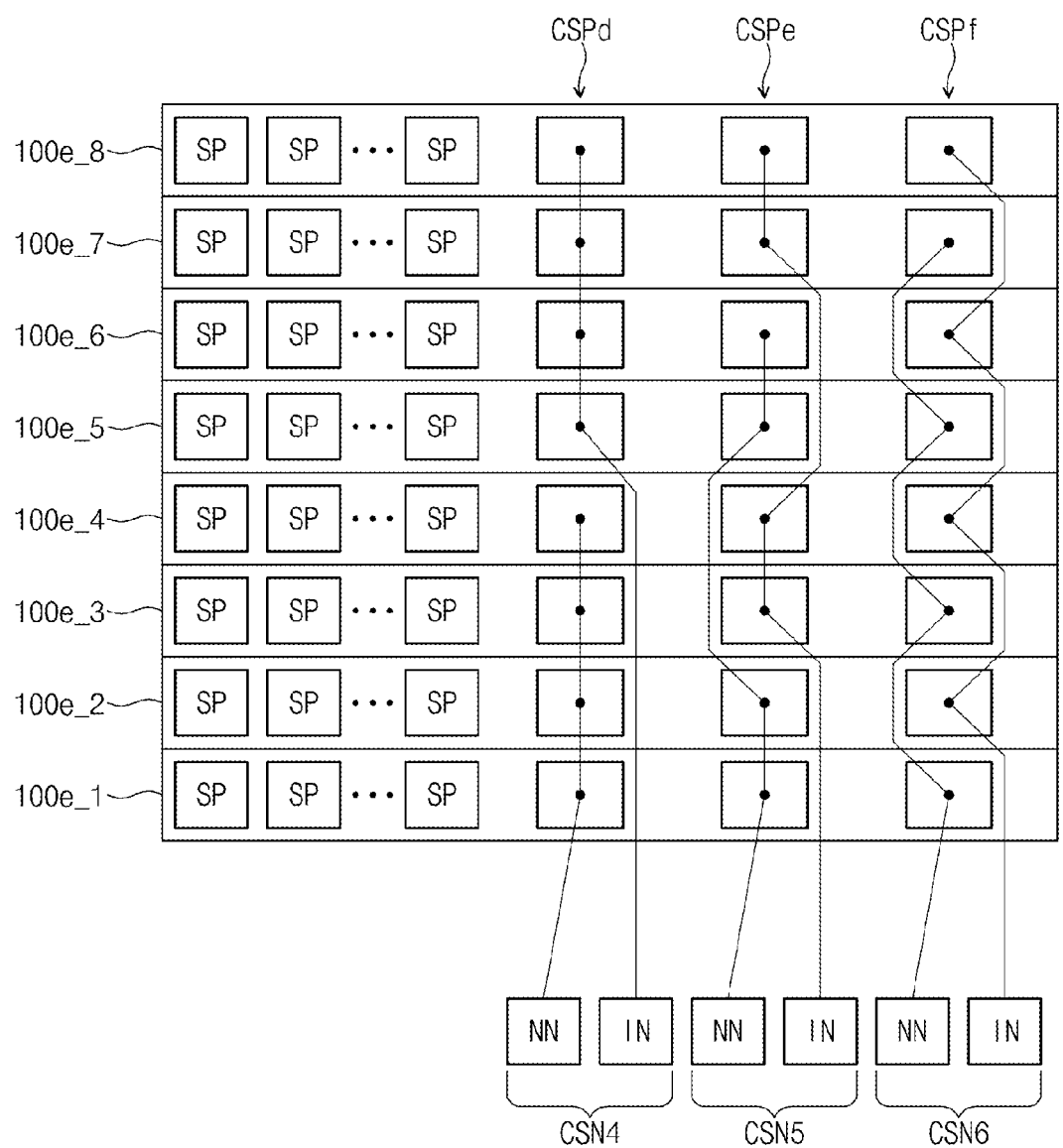
FIG. 35 is a diagram illustrating an interconnection between the first to eighth memory chips constituting a semiconductor package.

FIG. 35 is a diagram illustrating an interconnection between the first to eighth memory chips constituting a semiconductor package. Referring to FIG. 35, chip selection pads CSPd to CSPf of the first to eighth memory chips 100e_1 to 100e_8 may be connected electrically with the fourth to sixth chip selection nodes CSN4 to CSN6. Each of the fourth to sixth chip selection nodes CSN4 to CSN6 may include a normal node NN and an inverse node IN. As compared with FIG. 34, the normal nodes NN and the inverse nodes IN of the fourth to sixth chip selection nodes CSN4 to CSN6 may correspond to normal pads NP and inverse pads IP of chip selection pads CSP4 to CSP6, respectively.

Figure 36:
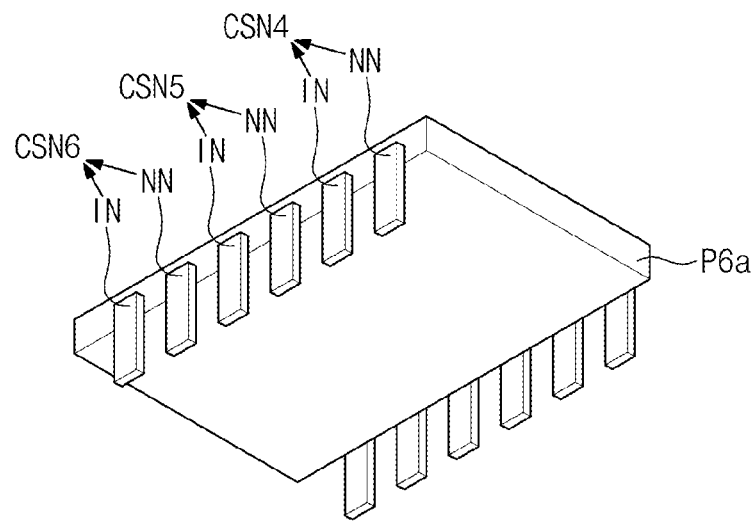
FIG. 36 is a diagram illustrating a semiconductor package including the first to eighth memory chips or a memory controller chip.

FIG. 36 is a diagram illustrating a semiconductor package including the first to eighth memory chips or a memory controller chip. Referring to FIG. 36, a semiconductor package P6a may include a plurality of nodes. The plurality of nodes may be a plurality of pins.

When the first to eighth memory chips 100e_1 to 100e_8 constitute a semiconductor package P6a, a part of the plurality of pins may be normal and inverse nodes NN and IN of the fourth to sixth chip selection nodes CSN4 to CSN6.

When a memory controller chip 100f forms the semiconductor package P6a, a part of the plurality of pins may be connected with normal and inverse nodes NN and IN of the fourth to sixth chip selection pads CSP4 to CSP6.

Figure 37:
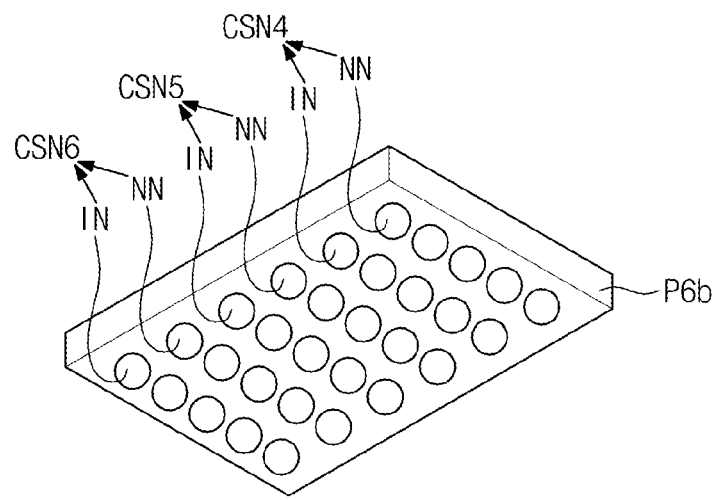
FIG. 37 is a diagram illustrating a semiconductor package including the first to eighth memory chips or a memory controller chip.

FIG. 37 is a diagram illustrating a semiconductor package including the first to eighth memory chips or a memory controller chip. Referring to FIG. 37, a semiconductor package P6b may include a plurality of nodes. The plurality of nodes may be a plurality of solder balls.

When the first to eighth memory chips 100e_1 to 100e_8 constitute a semiconductor package P6b, a part of the plurality of solder balls may be normal and inverse nodes NN and IN of the fourth to sixth chip selection nodes CSN4 to CSN6.

When a memory controller chip 100f forms the semiconductor package P6b, a part of the plurality of solder balls may be connected with normal and inverse nodes NN and IN of the fourth to sixth chip selection pads CSP4 to CSP6.

Figure 38:
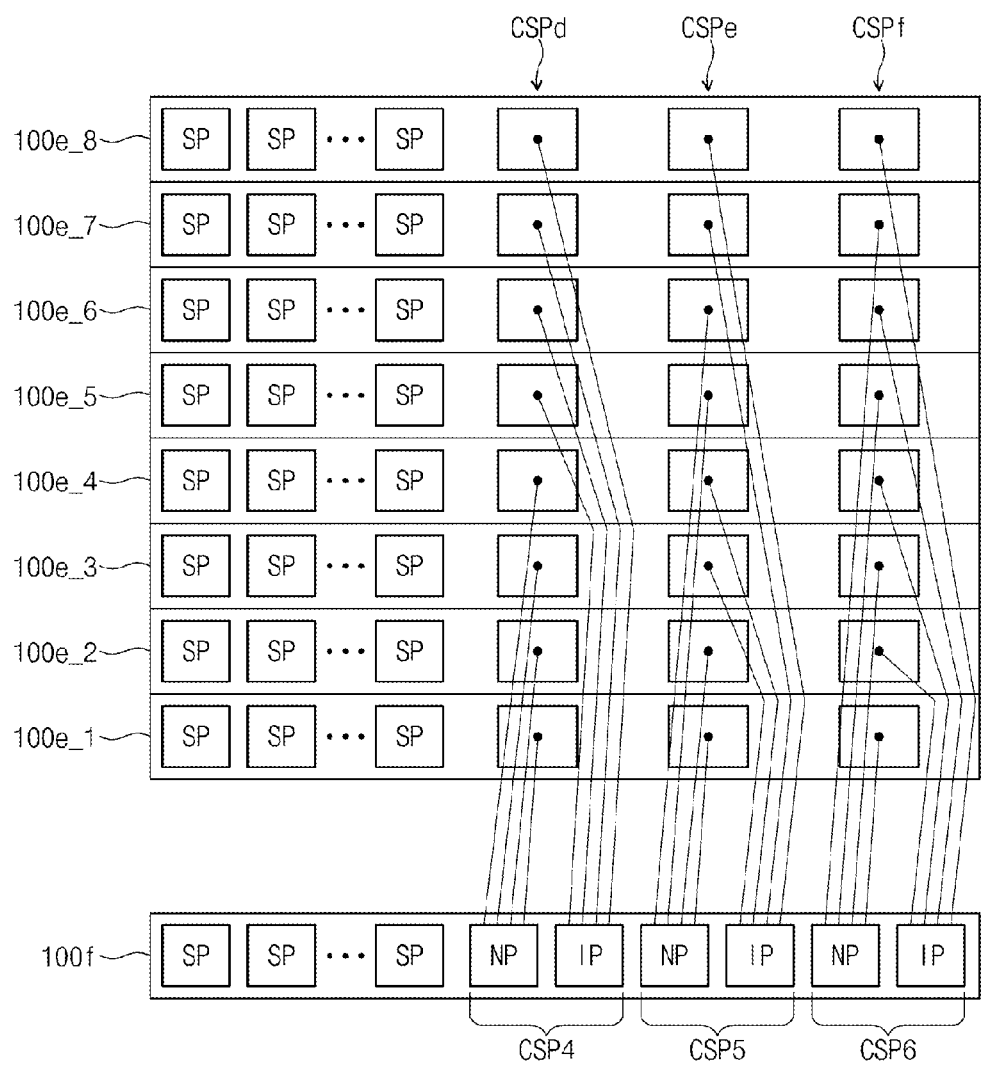
FIG. 38 is a diagram illustrating an interconnection structure between memory chips and a memory controller chip according to still another exemplary embodiment.

FIG. 38 is a diagram illustrating an interconnection structure between memory chips and a memory controller chip according to still another exemplary embodiment. As described with reference to FIG. 22, a plurality of memory chips 100e_1 to 100e_8 may be stacked in a vertical pillar shape, exemplarily.

Referring to FIG. 38, specific chip selection pads of the first to eighth memory chips 100e_1 to 100e_8 may be electrically connected with a specific control chip selection pad of a memory controller chip 100f. A part of specific chip selection pads may be electrically connected with a normal pad NP of a specific control chip selection pad, and the remaining thereof may be electrically connected with an inverse pad IP. Chip selection pads connected with the normal pad NP may be connected in common with the normal pad NP via one conduction line. Chip selection pads connected with the inverse pad IP may be connected in common with the inverse pad IP via one conduction line.

The first to eighth memory chips 100e_1 to 100e_8 may be electrically connected with the fourth to sixth control chip selection pads CSP4 to CSP6 including normal pads NP and inverse pads IP of the memory controller chip 100f via different patterns.

The first to eighth memory chips 100e_1 to 100e_8 may be selected individually in the same manner as described with reference to FIGS. 7 to 14. Memory chips may be independently selected using signals of which the number is less than that of memory chips.

As described with reference to FIG. 25, the first to eighth memory chips 100e_1 to 100e_8 may constitute a semiconductor package with a memory controller chip 100f. The first to eighth memory chips 100e_1 to 100e_8 and the memory controller chip 100f may be interconnected as illustrated in FIG. 38.

As described with reference to FIG. 26, the first to eighth memory chips 100e_1 to 100e_8 may constitute a semiconductor package.

Figure 39:
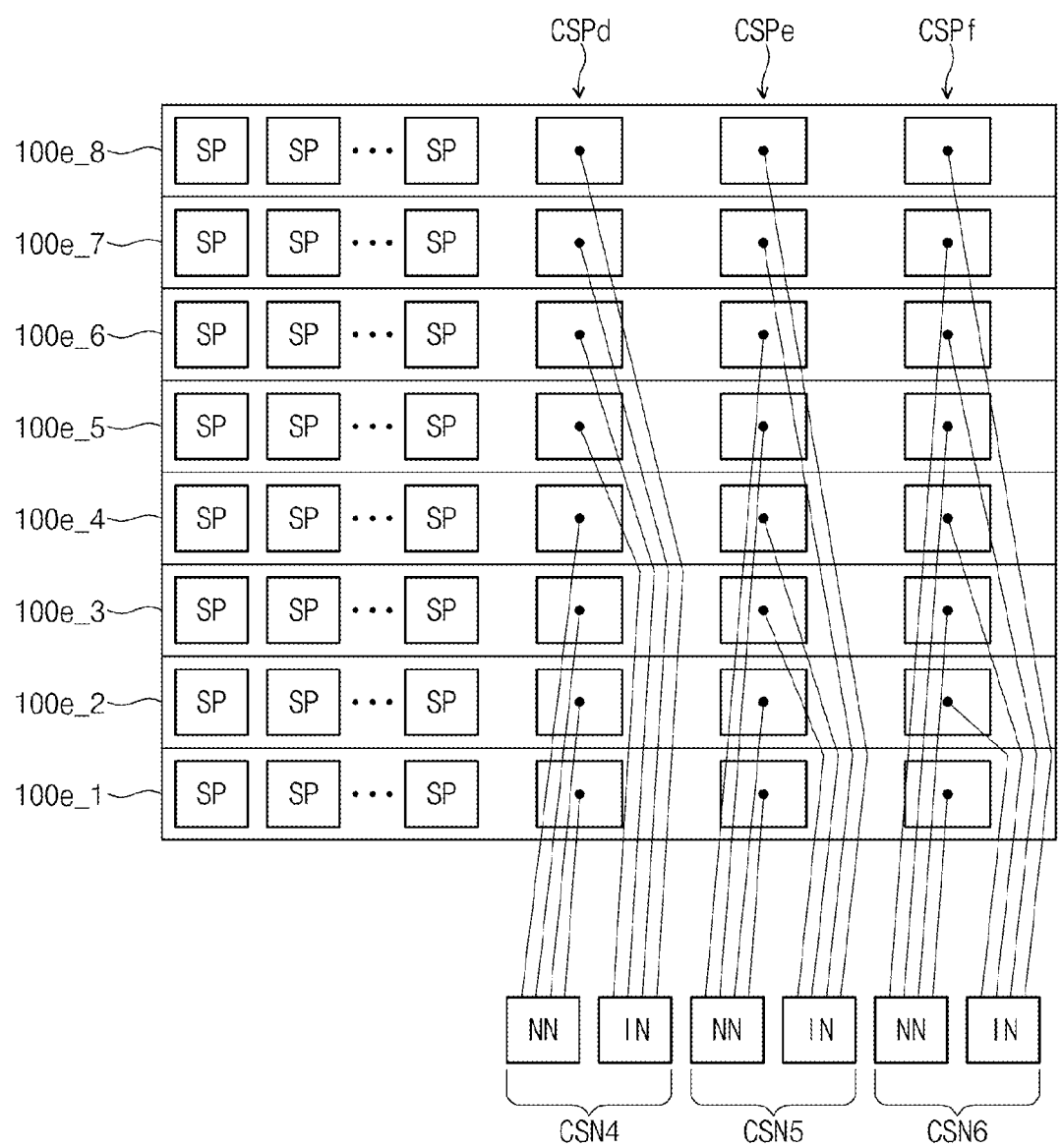
FIG. 39 is a diagram illustrating an interconnection structure between memory chips and a memory controller chip constituting a semiconductor package according to another exemplary embodiment.

FIG. 39 is a diagram illustrating an interconnection structure between memory chips and a memory controller chip constituting a semiconductor package according to another exemplary embodiment. Referring to FIG. 39, chip selection pads CSPd to CSPf of the first to eighth memory chips 100e_1 to 100e_8 may be electrically connected with the fourth to sixth chip selection nodes CSN4 to CSN6. Each of the fourth to sixth chip selection nodes CSN4 to CSN6 may include a normal node NN and an inverse node IN. As compared with FIG. 38, normal nodes NN and inverse nodes IN of the fourth to sixth chip selection nodes CSN4 to CSN6 may correspond to normal pads NP and inverse pads IP of control chip selection pads CSP4 to CSP6, respectively.

Nodes of the semiconductor package may be configured as illustrated in FIG. 36 or 37.

Figure 40:
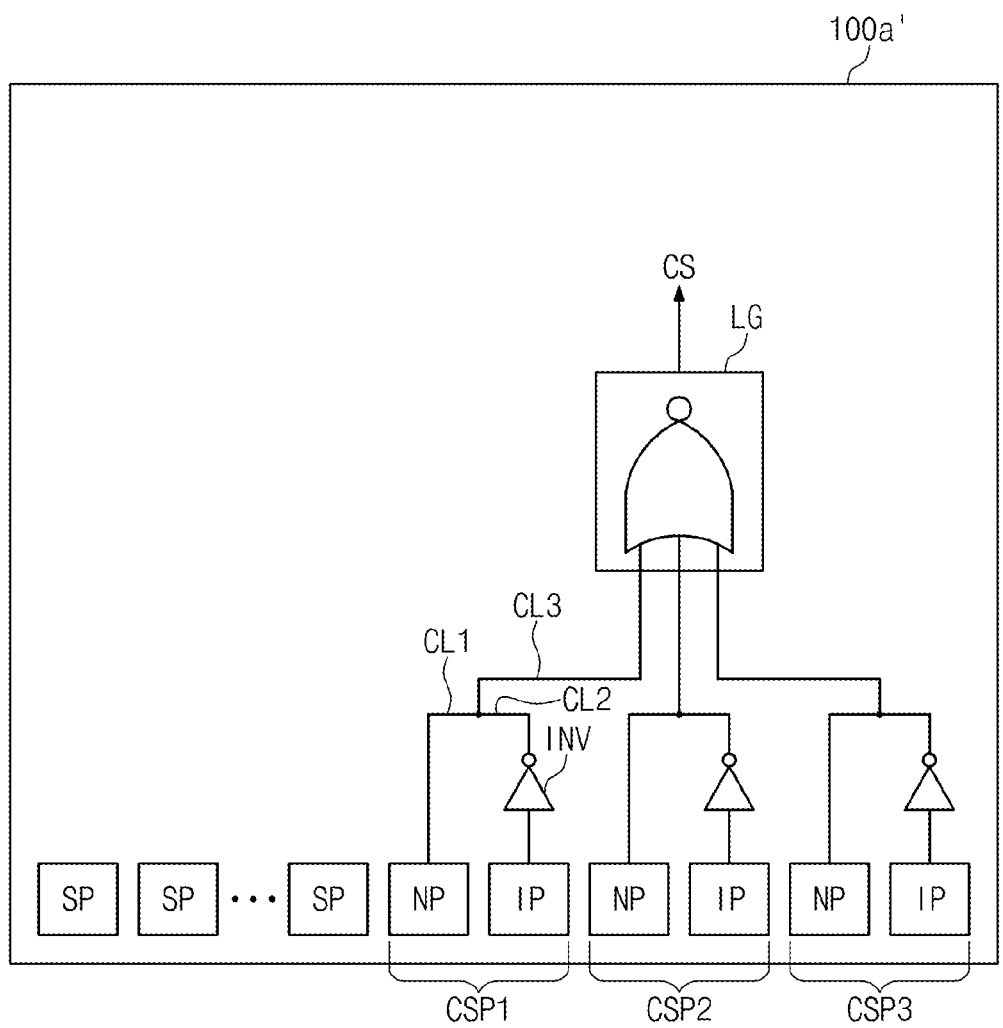
FIG. 40 is a diagram illustrating a memory chip according to still another exemplary embodiment.

FIG. 40 is a diagram illustrating a memory chip according to still another exemplary embodiment. As compared with a memory chip 100a in FIG. 2, a logic gate LG may be configured to perform a NOR operation. In other words, when normal pads NP of chip selection pads CSP1 to CSP3 are supplied with '0' or inverse pads IP thereof are supplied with '0', a chip selection signal CS may be activated. The memory chip 100a' may be used to form various packages as described with reference to FIGS. 1 to 39.

Figure 41:
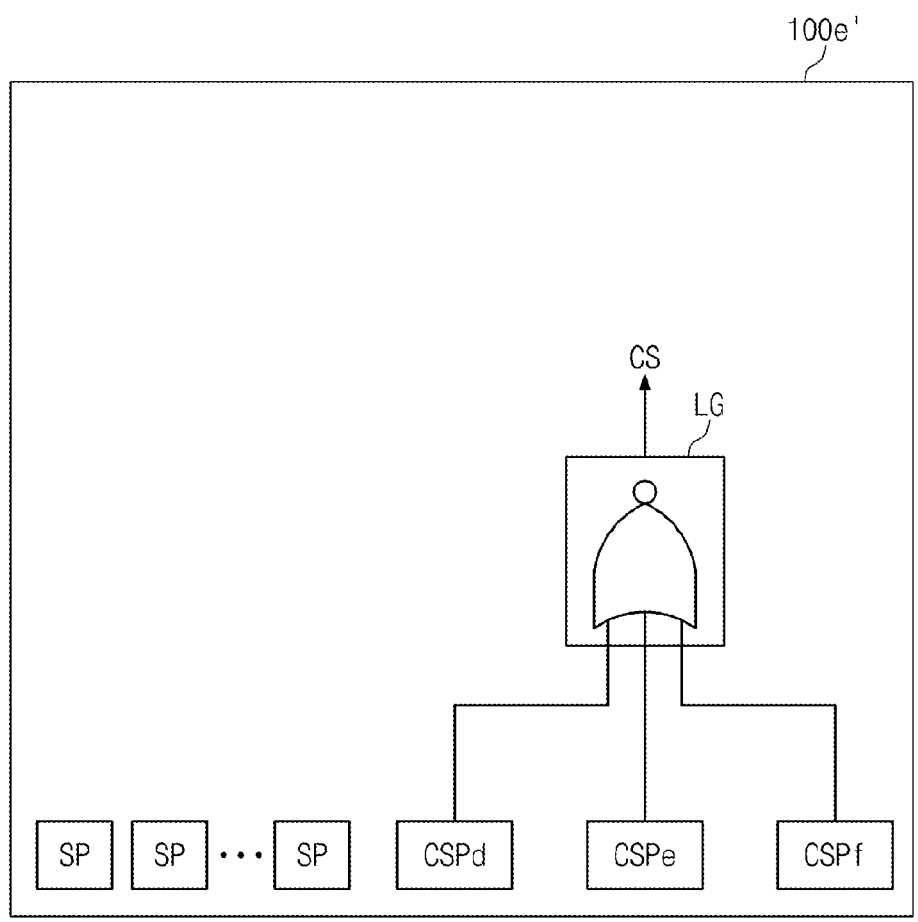
FIG. 41 is a diagram illustrating a memory chip according to still another exemplary embodiment.

FIG. 41 is a diagram illustrating a memory chip according to still another exemplary embodiment. As compared with a memory chip 100a in FIG. 32, a logic gate LG may be configured to perform a NOR operation. In other words, a chip selection signal CS may be activated when '0' is applied to chip selection pads CSPd to CSPf. The memory chip 100e' may be used to form various packages as described with reference to FIGS. 1 to 39.

Figure 42:
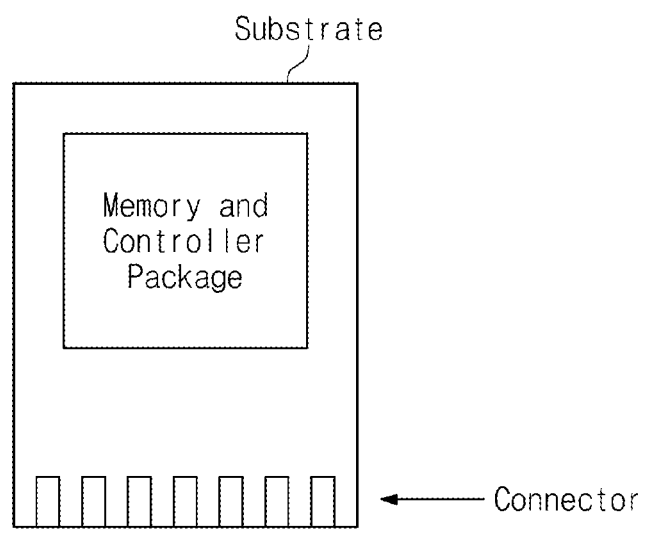
FIG. 42 is a diagram illustrating a memory card according to an exemplary embodiment.

FIG. 42 is a diagram illustrating a memory card according to an exemplary embodiment. A memory card may include a substrate, a memory and controller package, and a connector. The memory and controller package may include memory chips and a controller chip. The controller chip may select memory chips independently using signals of which the number is less than that of memory chips. The memory and controller package may include memory chips and a controller chip described with reference to FIGS. 1 to 41. The memory and controller package may communicate with an external device via the connector.

Figure 43:
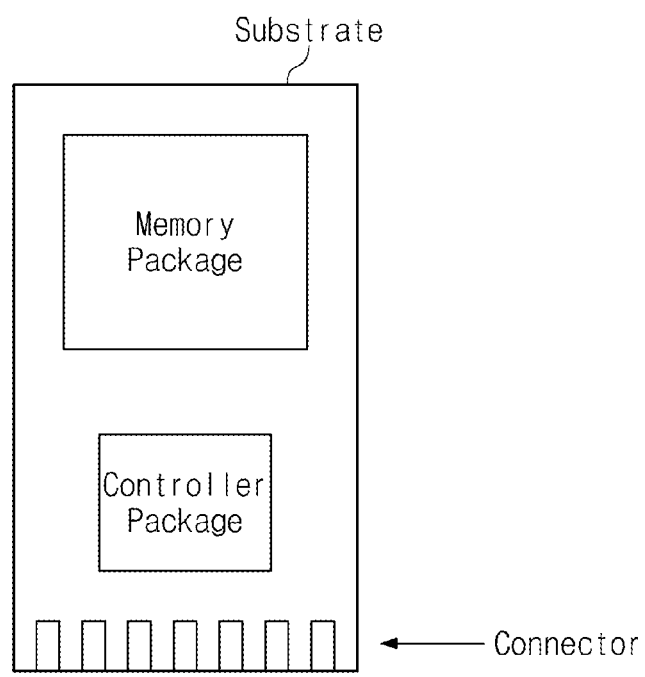
FIG. 43 is a diagram illustrating a memory card according to another exemplary embodiment.

FIG. 43 is a diagram illustrating a memory card according to another exemplary embodiment. A memory card may include a substrate, a memory package, a controller package, and a connector. The memory package may include memory chips described with reference to FIGS. 1 to 41. The controller package may include a controller chip. The controller package may include a controller chip described with reference to FIGS. 1 to 41. The controller package may select memory chips of the memory package independently using signals of which the number is less than that of memory chips of the memory package. The memory and controller package may communicate with an external device via the connector.

A memory card in FIG. 42 or 43 may be a PC (PCMCIA, personal computer memory card international association) card, a compact flash card, a smartmedia card (SM, SMC), a memory stick, a multimedia card (MMC, RS-MMC, MMC-micro), an SD card (SD, miniSD, microSD, SDHC), or a universal flash storage (UFS) device.

Figure 44:
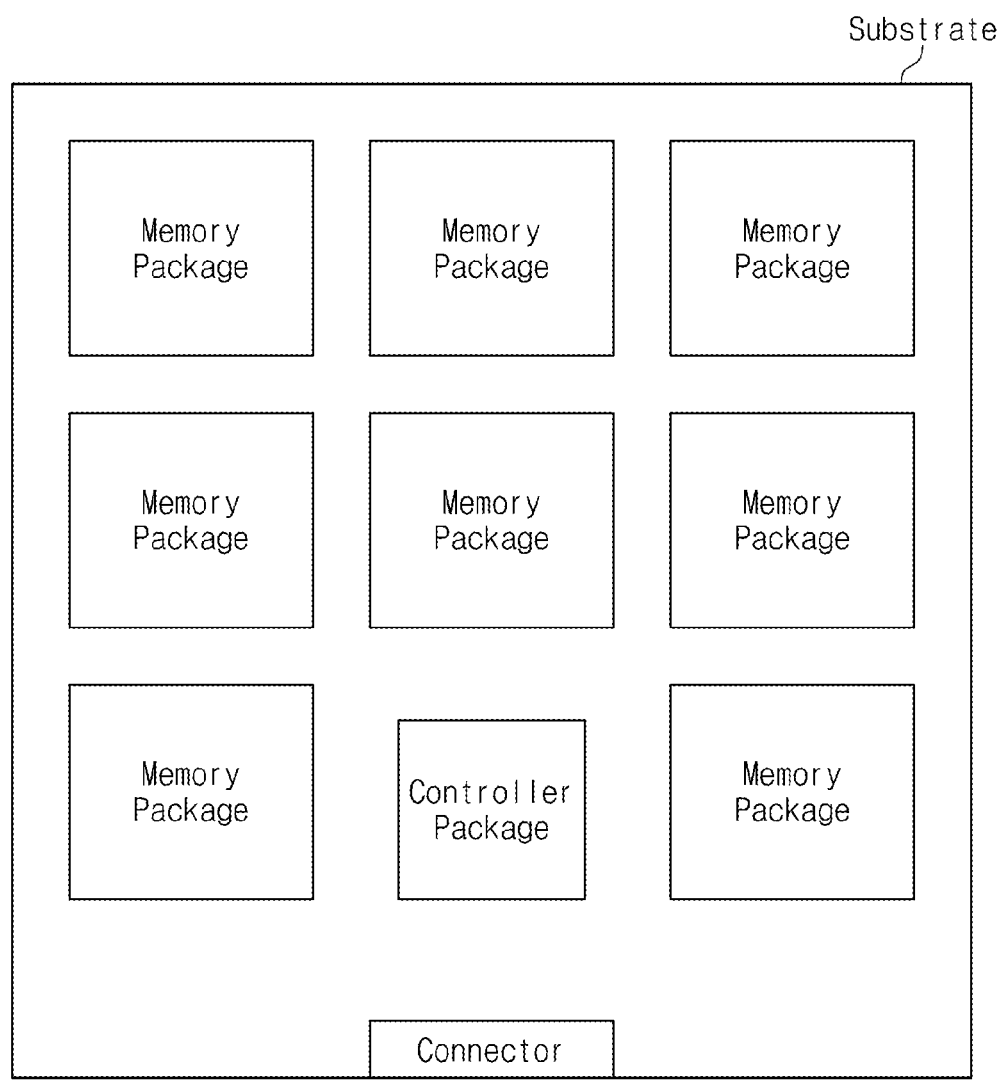
FIG. 44 is a diagram illustrating a solid state drive according to an exemplary embodiment.

FIG. 44 is a diagram illustrating a solid state drive according to an exemplary embodiment. Referring to FIG. 44, a solid state drive may include a substrate, a plurality of memory packages, a controller package, and a connector. Each memory package may include memory chips described with reference to FIGS. 1 to 41. The controller package may include a controller chip described with reference to FIGS. 1 to 41. The controller package may select memory chips of each memory package independently using signals of which the number is less than that of memory chips of each memory package. Each memory package or the controller package may communicate with an external device via the connector.

With embodiments, reduction of the complexity and improvement of a yield may be accomplished by selecting memories independently using chip selection signal lines of which the number is less than that of memories.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
   first and second memory chips configured to be stacked,
   wherein one memory chip of the first and second memory chips comprises a plurality of signal and power pads and a plurality of chip selection pads,
   wherein first pads of the chip selection pads are electrically connected to a device external to the one memory chip and second pads of the chip selection pads are electrically isolated from the device.

2. The semiconductor package of claim 1, wherein the chip selection pads include a normal pad and an inverse pad.

3. The semiconductor package of claim 2, wherein the first and second memory chips are stacked in a cascade shape.

4. The semiconductor package of claim 3, wherein one of a first normal pad and a first inverse pad of the first memory chip is connected with a first conduction line and the other one of the first normal pad and the first inverse pad of the first memory chip is floated.

5. The semiconductor package of claim 4, wherein one of a second normal pad and a second inverse pad of the second memory chip is connected with the first conduction line and the other one of the second normal pad and the second inverse pad of the second memory chip is floated.

6. The semiconductor package of claim 4, wherein one of a second normal pad and a second inverse pad of the first memory chip is connected with a second conduction line, different from the first conduction line, and the other one of the second normal pad and the second inverse pad of the first memory chip is floated.

7. The semiconductor package of claim 4, further comprising:
   a controller chip configured to control the first and second memory chips,
   wherein the controller chip comprises a plurality of second signal and power pads corresponding to the plurality of signal and power pads; and a plurality of control chip selection pads,
   wherein the first conduction line is connected with one of the plurality of control chip selection pads.

8. The semiconductor package of claim 7, wherein the controller chip is configured to select one of the first and second memory chips by controlling output signals of the plurality of control chip selection pads.

9. The semiconductor package of claim 4, further comprising:
   a plurality of signal and power input and output nodes corresponding to the plurality of signal and power pads; and
   a plurality of chip selection nodes,
   wherein the first conduction line is connected with one of the plurality of chip selection nodes.

10. The semiconductor package of claim 9, wherein the plurality of chip selection nodes include a plurality of pins or a plurality of solder balls.

11. The semiconductor package of claim 1, wherein the first and second memory chips are stacked in a vertical pillar shape.

12. The semiconductor package of claim 11, further comprising:
   a controller chip configured to control the first and second memory chips,
   wherein the controller chip comprises a plurality of second signal and power pads corresponding to the plurality of signal and power pads; and a plurality of control chip selection pads, at least one of the plurality of control chip selection pads corresponds with the plurality of chip selection pads.

13. The semiconductor package of claim 12, wherein one of the first pads of the first memory chip is electrically connected with a first control chip selection pad of the plurality of control chip selection pads.

14. The semiconductor package of claim 13, wherein one of the first pads of the second memory chip is electrically connected with the first control chip selection pad.

15. The semiconductor package of claim 13, wherein another one of the first pads of the first memory chip is electrically connected with a second control chip selection pad, different from the first control chip selection pad, of the plurality of control chip selection pads.

16. The semiconductor package of claim 11, further comprising:
   a plurality of signal and power input and output nodes corresponding to the plurality of signal and power pads; and
   a plurality of chip selection nodes, at least one of the plurality of chip selection nodes corresponds with the plurality of chip selection pads.

17. The semiconductor package of claim 16, wherein one of the first pads of the first memory chip is electrically connected with a first chip selection node of the plurality of chip selection nodes.

18. The semiconductor package of claim 17, wherein one of the first pads of the second memory chip is electrically connected with the first chip selection node.

19. The semiconductor package of claim 17, wherein another one of the first pads of the first memory chip is electrically connected with a second chip selection node, different from the first chip selection node, of the plurality of chip selection nodes.

20. The semiconductor package of claim 1, wherein the first and second memory chips are stacked in a cascade shape.

21. The semiconductor package of claim 20, wherein a first part of first pads of the first and second memory chips are connected in common with a first conduction line and a second part of the first pads are connected in common with a second conduction line.

22. The semiconductor package of claim 1, wherein the first memory chip comprises:
   a plurality of chip selection solder bumps;
   a plurality of through silicon vias electrically connected with the plurality of chip selection solder bumps and the plurality of chip selection pads of the first memory chip; and
   first and second fuses electrically connected with a through silicon via of the plurality of through silicon vias.

23. The semiconductor package of claim 22, wherein the second memory chip has a same structure as the first memory chip,
   wherein chip selection solder bumps of the second memory chip are connected with the chip selection pads of the first memory chip.

24. The semiconductor package of claim 22, wherein one of the first and second fuses connected with the through silicon via of the first memory chip is cut and the other one of the first and second fuses maintains an electric connection state.

25. A semiconductor package comprising:
   a plurality of memory chips configured to be stacked; and
   a controller chip configured to control the plurality of memory chips,
   wherein one memory chip of the first and second memory chips comprises a plurality of signal and power pads and a plurality of chip selection pads,
   wherein the controller chip comprises a plurality of control chip selection pads, a first control chip selection pad of the plurality of control chip selection pads is connected with first chip selection pads of first memory chips of the plurality of memory chips, and a second control chip selection pad of the plurality of control chip selection pads is connected with second chip selection pads of second memory chips, different from the first memory chips, of the plurality of memory chips.

26. The semiconductor package of claim 25, wherein the first control chip selection pads are connected with the first chip selection pads in common through a first conduction line.

27. The semiconductor package of claim 25, wherein the second control chip selection pads are connected with the second chip selection pads in common through a second conduction line.

28. The semiconductor package of claim 25, wherein
   a third control chip selection pad of the plurality of control chip selection pads is connected with third chip selection pads of third memory chips of the plurality of memory chips,
   wherein a first part of the third memory chips are overlapped with the first memory chips and a second part of the third memory chips are overlapped with the second memory chips.

29. The semiconductor package of claim 28,
   wherein a fourth control chip selection pad of the plurality of control chip selection pads is connected with fourth chip selection pads of fourth memory chips, different from the third memory chips, of the plurality of memory chips, wherein a third part of the fourth memory chips are overlapped with the first memory chips and a fourth part of the fourth memory chips are overlapped with the second memory chips.

30. The semiconductor package of claim 25, wherein the first control chip selection pad is a normal pad and the second control chip selection pad is an inverse pad, the normal pad and the inverse pad forming a differential pair.

31. The semiconductor package of claim 30, wherein the normal pad and the inverse pad are connected with different memory chips each other.

32. A semiconductor package comprising:
a controller chip configured to control a memory;
a plurality of signal and power nodes electrically connected with a plurality of signal and power pads of the controller chip; and
a plurality of chip selection nodes electrically connected with a plurality of chip selection pads of the controller chip,
wherein a chip selection pad of the plurality of chip selection nodes comprises a normal pad and an inverse pad, and
wherein the chip selection node of the plurality of chip selection nodes comprises the normal node and the inverse node, at least one of the normal node and the inverse node is connected with the normal pad and the inverse pad.

33. A memory controller chip comprising:
a plurality of signal and power pads; and
a plurality of chip selection pads including a normal pad and an inverse pad, the normal pad and the inverse pad being a differential pair,
wherein the chip selection pads are independently controlled to have a logically high or a logically low value, and
wherein a combination of the chip selection pads is output as a chip selection signal.

34. A memory system comprising:
first and second memory chips configured to be stacked; and
a memory controller chip configured to control the first and second memory chips,
wherein one of the first and second memory chips is configured to communicate with the memory controller chip via a plurality of signal and power pads and a plurality of chip selection pads,
wherein one of the first and second memory chips and the memory controller chip includes a normal chip selection pad and an inverse chip selection pad.

35. The memory system of claim 34, wherein the first and second memory chips and the memory controller chip constitute a memory card.

36. The memory system of claim 34, wherein the first and second memory chips and the memory controller chip constitute a solid state drive.

37. The memory system of claim 34, wherein the first and second memory chips and the memory controller chip form a single package.

38. The memory system of claim 34, wherein the first and second memory chips form a memory package and the memory controller chip forms a controller package.

39. A solid state drive comprising:
a substrate;
a plurality of memory packages;
a controller package; and
a connector,
wherein at least one of the plurality of memory packages comprises first and second memory chips, the first and second memory chips are configured to be stacked, and
wherein the controller package comprises a controller chip, the controller chip configured to select the at least one of the plurality of memory packages using a smaller number of signals than a total number of signals of the at least one of the plurality of memory packages.

40. The solid state drive of claim 39, wherein at least one of the plurality of memory packages and the controller package communicates with an external device via the connector.

* * * * *